United States Patent
Hara et al.

(10) Patent No.: US 12,501,581 B2
(45) Date of Patent: Dec. 16, 2025

(54) COOLING SYSTEM

(71) Applicant: MITSUBISHI HEAVY INDUSTRIES, LTD., Tokyo (JP)

(72) Inventors: Nobuhide Hara, Tokyo (JP); Yuichi Otani, Tokyo (JP); Sumiu Uchida, Tokyo (JP); Tadahiko Suzuta, Tokyo (JP); Hiroko Kitamoto, Tokyo (JP); Kentaro Hayashi, Tokyo (JP); Atsushi Imai, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 172 days.

(21) Appl. No.: 18/284,671

(22) PCT Filed: Feb. 14, 2022

(86) PCT No.: PCT/JP2022/005728
§ 371 (c)(1),
(2) Date: Sep. 28, 2023

(87) PCT Pub. No.: WO2022/209359
PCT Pub. Date: Oct. 6, 2022

(65) Prior Publication Data
US 2024/0172396 A1      May 23, 2024

(30) Foreign Application Priority Data
Apr. 1, 2021 (JP) .................................. 2021-062776

(51) Int. Cl.
*H05K 7/20*      (2006.01)
(52) U.S. Cl.
CPC ..... *H05K 7/20336* (2013.01); *H05K 7/20136* (2013.01); *H05K 7/20936* (2013.01)

(58) Field of Classification Search
CPC .. H05K 7/20; H05K 7/20936; H05K 7/20136; H05K 7/20818; H05K 7/203;
(Continued)

(56) References Cited

U.S. PATENT DOCUMENTS 4,154,296 A * 5/1979 Fijas ......................... F28F 1/32
                                                       165/184
5,803,165 A   9/1998 Shikazono et al.
(Continued)

FOREIGN PATENT DOCUMENTS

CN   101196381 A  *  6/2008
JP   S5666688 A      6/1981
(Continued)

OTHER PUBLICATIONS

International Search Report issued in International Application No. PCT/JP2022/005728, mailed May 10, 2022 (6 pages).
(Continued)

*Primary Examiner* — Harry E Arant
(74) *Attorney, Agent, or Firm* — Osha Bergman Watanabe & Burton LLP

(57) ABSTRACT

A cooling system of the present disclosure includes: a coolant tank storing a coolant removing heat from a heating element in a closed space as an inner space; a plurality of heat pipes that are arranged to extend from the coolant tank toward the outside of the coolant tank and respectively having passages allowing the coolant as a working fluid to be movable therethrough; and a blower fan blowing air to the plurality of heat pipes from the outside of the coolant tank in a direction in which the heat pipes are arranged, wherein a cross-sectional shape orthogonal to the extension direction of each heat pipe is a flat plate shape having a leading edge on an upstream side of a blowing direction of the blower fan and a trailing edge on a downstream side
(Continued)

thereof with the blowing direction as a longitudinal direction.

9 Claims, 21 Drawing Sheets

(58) Field of Classification Search
CPC ............ H05K 7/20336; F28D 1/05325; F28D 15/0275; F28D 15/0266; F28F 1/04; F28F 1/32; F28F 1/40; G06F 1/20
See application file for complete search history.

(56) References Cited

U.S. PATENT DOCUMENTS

| | | | |
|---|---|---|---|
| 2010/0193163 A1* | 8/2010 | Rollins | F04D 25/0606 417/423.1 |
| 2011/0214840 A1 | 9/2011 | Sakamoto et al. | |
| 2012/0073789 A1 | 3/2012 | Bhattacharya et al. | |
| 2014/0083652 A1 | 3/2014 | Matsunaga et al. | |
| 2015/0241096 A1 | 8/2015 | Matsunaga et al. | |
| 2015/0334876 A1 | 11/2015 | Endo et al. | |
| 2016/0073548 A1 | 3/2016 | Wei et al. | |
| 2017/0325355 A1 | 11/2017 | Lau | |
| 2018/0153058 A1 | 5/2018 | Hirai et al. | |
| 2018/0187979 A1 | 7/2018 | Drolen et al. | |
| 2020/0267872 A1 | 8/2020 | Harada et al. | |
| 2022/0034596 A1 | 2/2022 | Haruki et al. | |
| 2023/0089621 A1 | 3/2023 | Hara et al. | |

FOREIGN PATENT DOCUMENTS

| | | |
|---|---|---|
| JP | S56101695 U | 8/1981 |
| JP | S60263064 A | 12/1985 |
| JP | H0364950 A | 3/1991 |
| JP | H06021279 A | 1/1994 |
| JP | H07161888 A | 6/1995 |
| JP | H07335797 A | 12/1995 |
| JP | H094994 A | 1/1997 |
| JP | H09068396 A | 3/1997 |
| JP | H1026488 A | 1/1998 |
| JP | 2005299956 A | 10/2005 |
| JP | 2008025884 A | 2/2008 |
| JP | 4347990 B2 | 10/2009 |
| JP | 5797758 B2 | 10/2015 |
| JP | 2015220363 A | 12/2015 |
| JP | 201654248 A | 4/2016 |
| JP | 201888433 A | 6/2018 |
| JP | 2018115858 A | 7/2018 |
| JP | 2018162962 A | 10/2018 |
| JP | 2019516195 A | 6/2019 |
| JP | 2020136335 A | 8/2020 |
| JP | 2022100459 A | 7/2022 |
| WO | 2010058520 A1 | 5/2010 |
| WO | 2012161334 A1 | 11/2012 |
| WO | 2015128951 A1 | 9/2015 |
| WO | 2020138081 A1 | 7/2020 |

OTHER PUBLICATIONS

Written Opinion issued in International Application No. PCT/JP2022/005728, mailed May 10, 2022 (13 pages).

* cited by examiner

COOLING SYSTEM

TECHNICAL FIELD

The present disclosure relates to a cooling system.
Priority is claimed on Japanese Patent Application No. 2021-62776, filed Apr. 1, 2021, the content of which is incorporated herein by reference.

BACKGROUND ART

Patent Document 1 discloses a cooling system that cools an electronic device with a working fluid and cools the evaporated working fluid with a heat pipe.

Patent Document 2 discloses a cooling system that immerses an electronic device in a coolant and cools the evaporated coolant via fins.

Patent Document 3 discloses a cooling system that cools an electronic device by immersing the electronic device in a coolant and cools the coolant with a heat pipe.

Patent Document 4 discloses a cooling system that cools an electronic device with a coolant and transfers the evaporated coolant by a heat pipe to be cooled and condensed.

Patent Document 5 discloses a cooling system that immerses an electronic device in a coolant and condenses the evaporated coolant in a cooling pipe.

Patent Document 6 discloses a cooling system that connects a heat pipe to a computer and cools a working fluid evaporated in the heat pipe by a heat exchanger at a bottom of a chimney.

Patent Document 7 discloses a cooling system that cools a primary coolant cooling a server by a secondary coolant and cools the secondary coolant by exchanging heat with the outside air.

Patent Document 8 discloses a heat exchanger in which air and a coolant flow in the same direction.

CITATION LIST

Patent Document(s)

Patent Document 1: Japanese Unexamined Patent Application No. H6-21279
Patent Document 2: Japanese Unexamined Patent Application No. 2016-54248
Patent Document 3: Japanese Unexamined Patent Application No. 2018-88433
Patent Document 4: PCT International Publication No. WO 2015/128951
Patent Document 5: Published Japanese Translation No. 2019-516195
Patent Document 6: Japanese Patent No. 5797758
Patent Document 7: Japanese Unexamined Patent Application No. 2020-136335
Patent Document 8: Japanese Patent No. 4347990

SUMMARY OF INVENTION

Technical Problem

In recent years, since the heat generation density of the electronic devices has increased, it is desired to further improve cooling efficiency.

Further, when transferring the evaporated coolant to a place suitable for cooling and condensation, it is preferable to transfer the evaporated coolant without using external energy of a pump or the like from the viewpoint of energy saving.

Further, when the heat generation density of the electronic device is high, there is a problem that the above-described film is formed by the coolant and the heat removing ability is lowered at the contact points between the coolant and the electronic device.

Further, it is preferable that the equipment for cooling the evaporated coolant is easily maintained.

The present disclosure has been made to solve the above-described problems and a first object is to provide a cooling system capable of improving cooling efficiency.

Further, a second object of the present disclosure is to provide a cooling system capable of realizing energy saving when transferring a coolant.

Furthermore, a third object of the present disclosure is to provide a cooling system capable of maintaining high ability of removing heat from a heating element by a coolant.

Furthermore, a fourth object of the present disclosure is to provide a cooling system with high maintainability.

Solution to Problem

In order to solve the above-described problems, a cooling system according to a first aspect of the present disclosure includes: a coolant tank storing a coolant removing heat from a heating element in a closed space as an inner space; a plurality of heat pipes that are arranged to extend from the coolant tank toward the outside of the coolant tank and respectively having passages allowing the coolant as a working fluid to be movable therethrough; and a blower fan blowing air to the plurality of heat pipes from the outside of the coolant tank in a direction in which the heat pipes are arranged, wherein a cross-sectional shape orthogonal to the extension direction of each heat pipe is a flat plate shape having a leading edge on an upstream side of a blowing direction of the blower fan and a trailing edge on a downstream side thereof with the blowing direction as a longitudinal direction.

Further, a cooling system according to a second aspect of the present disclosure includes: an outer wall defining an indoor and an outdoor; a coolant tank that is disposed in the indoor and storing a coolant for removing heat from a heating element in a closed space as an inner space; a heat exchanger that is disposed in the outdoor; a gas-phase pipe guiding the coolant as a working fluid, having evaporated in the coolant tank to become a gas phase, to the heat exchanger; and a liquid-phase pipe guiding the coolant as a working fluid, having changed from a gas phase to a liquid phase in the heat exchanger, to the coolant tank.

Further, a cooling system according to a third aspect of the present disclosure includes: a coolant tank storing a coolant removing heat from a heating element in a closed space as an inner space; a heat radiator that is allowed to be immersed in the coolant inside the coolant tank and by which heat transferred from the heating element is received; and a heat transfer promoting unit that is configured to promote heat transfer to the coolant from a heat radiation surface of the heat radiator.

Further, a cooling system according to a fourth aspect of the present disclosure includes: a heat exchange unit including a heat transfer pipe group which includes a plurality of heat transfer pipes linearly extending in a vertical direction and having an air passage formed therein and in which coolant passages are formed between the heat transfer pipes by bundling the heat transfer pipes at intervals, a casing covering the heat transfer pipe group so that both ends of each heat transfer pipe open to the outside, a coolant supply section supplying a coolant into the casing, and a coolant discharge section discharging the coolant from the inside of the casing; and an air blower that is provided below the heat exchange unit and blowing air to the heat transfer pipe group from below.

Advantageous Effects of Invention

According to the present disclosure, it is possible to provide a cooling system capable of improving cooling efficiency.

Further, according to the present disclosure, it is possible to realize energy saving when transferring a coolant.

Furthermore, according to the present disclosure, it is possible to maintain high ability of removing heat from a heating element by a coolant.

Furthermore, according to the present disclosure, it is possible to provide the cooling system with high maintainability.

DESCRIPTION OF EMBODIMENTS

First Embodiment

Figure 1:
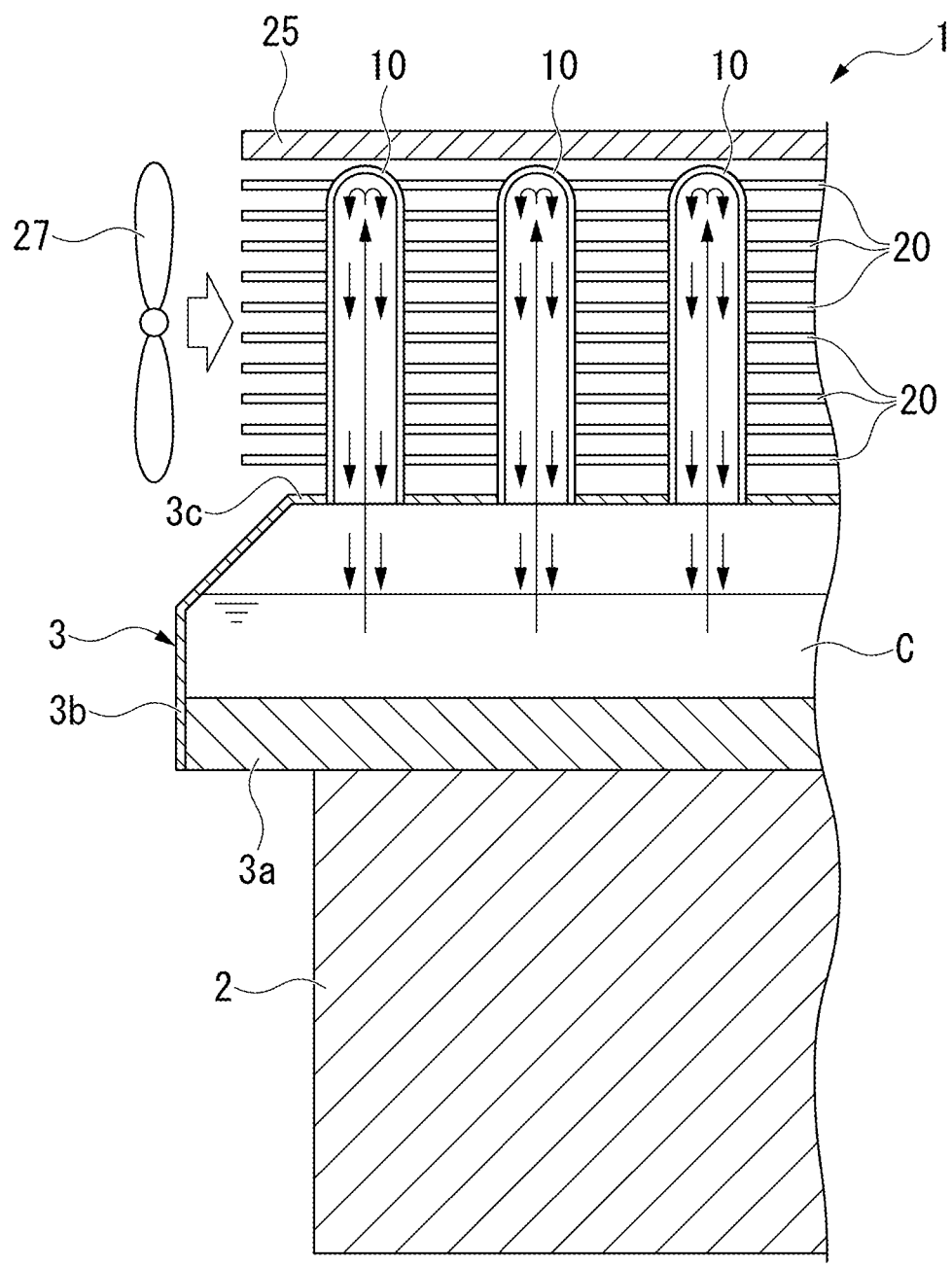
FIG. 1 is a longitudinal sectional view showing an overall configuration of a first cooling system according to a first embodiment of the present disclosure.
Figure 2:
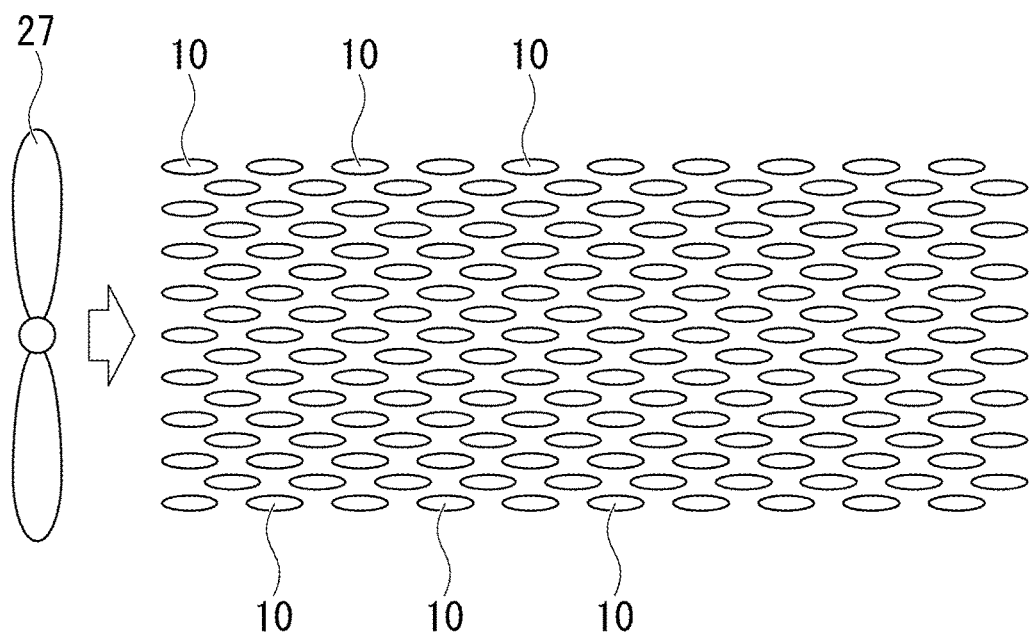
FIG. 2 is a schematic horizontal cross-sectional view of a heat pipe group of the first cooling system according to the first embodiment of the present disclosure.

Hereinafter, embodiments of the present invention will be described in detail with reference to FIGS. 1 to 4.
(First Cooling System)
As shown in FIGS. 1 and 2, a first cooling system 1 includes a server 2, a coolant tank 3, a heat pipe 10, a plate-shaped fin 20, a cover 25, and a blower fan 27.
(Server)
The server 2 is a heating element to be cooled in the first cooling system 1. The server 2 includes a casing, and equipment such as a CPU that constitutes a computer is stored in the casing. The server 2 of this embodiment has a substantially rectangular parallelepiped shape.
(Coolant Tank 3)
The coolant tank 3 is provided to contact the server 2. The coolant tank 3 of this embodiment is installed on the upper surface of the server 2. The coolant tank 3 includes a tank bottom wall 3a, a tank side wall 3b, and a tank top wall 3c.

The tank bottom wall 3a has a plate shape extending in the horizontal direction and is provided to contact the upper surface of the server 2. The tank bottom wall 3a extends from the upper surface of the server 2 to spread further in the horizontal direction. The tank bottom wall 3a is made of metal having high thermal conductivity, such as a material containing aluminum or copper.

The tank side wall 3b has a wall shape rising upward from the outer peripheral edge of the tank bottom wall 3a. The upper portion of the tank side wall 3b is inclined to recede from the outer peripheral edge of the tank bottom wall 3a as it goes upward.

The tank top wall 3c has a plate shape extending in the horizontal direction and is provided to close the upper end opening of the tank side wall 3b.

The coolant tank 3 has a hollow box shape whose interior is closed by the tank bottom wall 3a, the tank side wall 3b, and the tank top wall 3c. The coolant C is stored in the coolant tank 3. As the coolant C, a substance that is volatile and liquid at a room temperature (for example, water or air conditioning coolant) can be used.

(Heat Pipe)

A plurality of the heat pipes 10 are arranged to extend from the coolant tank 3 toward the outside of the coolant tank 3. The heat pipe 10 of this embodiment is provided to extend upward from the upper surface of the coolant tank 3, that is, the upper surface of the tank top wall 3c of the coolant tank 3.

The heat pipe 10 is made of metal with high thermal conductivity. The heat pipe 10 is made of, for example, a material containing copper or aluminum.

The heat pipe 10 has a hollow cylindrical shape extending upward and downward. The upper end of the heat pipe 10 is closed. The inner surface of the upper end of the heat pipe 10 has a concave curved surface that is concave upward.

The lower end which is one end of the heat pipe 10 communicates downward and is fixed to the upper surface of the tank top wall 3c. The heat pipe 10 communicates with the inside of the coolant tank 3 through the lower end. That is, in addition to the inner space of the coolant tank 3, the inner space of the heat pipe 10 communicating therewith is also a closed space isolated from the outside. Accordingly, the inside of the heat pipe 10 becomes a passage for the coolant C that has entered into the heat pipe 10.

The inner spaces of the coolant tank 3 and the heat pipe 10 are preferably evacuated while containing the coolant C. The coolant C is stored in the inner space in a gas phase and a liquid phase.

As shown in FIGS. 1 and 2, such heat pipes 10 are arranged with the horizontal direction as the arrangement direction. That is, the plurality of heat pipes 10 are arranged in a first horizontal direction (the left and right direction in FIGS. 1 and 2) and a second horizontal direction (the depth direction in FIG. 1 and the vertical direction in FIG. 2) orthogonal to the first horizontal direction. Each heat pipe 10 has the same structure.

Figure 3:
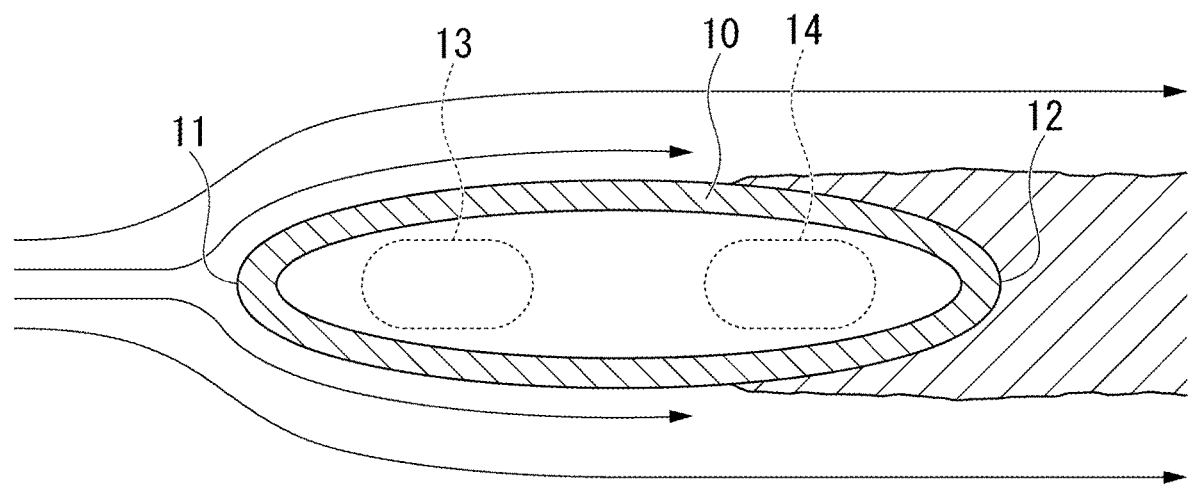
FIG. 3 is a horizontal cross-sectional view of a heat pipe of the first cooling system according to the first embodiment of the present disclosure and is a diagram illustrating a flow of air by a fan and a flow of coolant inside the heat pipe.

Here, as shown in FIGS. 2 and 3, the cross-sectional shape orthogonal to the extension direction of the heat pipe 10, that is, the horizontal cross-sectional shape of the heat pipe 10, is flat with the first horizontal direction as the longitudinal direction. The horizontal cross-sectional shape of the heat pipe 10 has a streamlined shape in which one side in the first horizontal direction (the left side in FIGS. 1 to 3) is a leading edge 11 and the other side in the first horizontal direction (the right side in FIGS. 1 to 3) is a trailing edge 12. The horizontal cross-sectional shape of the heat pipe 10 may have an elliptical shape with a major axis in the first horizontal direction and a minor axis in the second horizontal direction. The horizontal cross-sectional shape of the heat pipe 10 may be an airfoil having the leading edge 11 and the trailing edge 12 described above.

(Plate-Shaped Fin 20)

As shown in FIG. 1, the plate-shaped fin 20 has a plate shape spreading in the horizontal direction and a plurality of the plate-shaped fins are provided at intervals in the vertical direction. The plurality of heat pipes 10 contact each plate-shaped fin 20 to penetrate upward and downward. That is, each plate-shaped fin 20 is fixed to the outer peripheral surface of each heat pipe 10 via the inner peripheral edge of the hole through which the plurality of heat pipes 10 pass. The plate-shaped fin 20 is made of a material with high thermal conductivity such as metal containing copper or aluminum.

(Cover)

As shown in FIG. 1, the cover 25 is provided to surround the plurality of heat pipes 10 and the plurality of plate-shaped fins 20 from above and in the second horizontal direction. Accordingly, an air flow path extending in the first horizontal direction is defined in the cover 25. That is, the plurality of heat pipes 10 and the plurality of plate-shaped fins 20 are stored in a flow path defined by the cover 25.

(Blower Fan)

The blower fan 27 blows air in the horizontal direction which is the arrangement direction of the plurality of heat pipes 10. The blower fan 27 is provided on one side in the first horizontal direction of the flow path formed by the cover 25. The blower fan 27 blows air along the air flow path inside the cover 25 from one side to the other side in the first horizontal direction. One side in the first horizontal direction is the upstream side of the air flow and the other side in the first horizontal direction is the downstream side of the air flow.

(Operation and Effect of First Embodiment)

As shown in FIG. 1, when the server 2 generates heat due to its operation, the heat of the server 2 is transferred to the liquid-phase coolant C (condensate) in the coolant tank 3 through the tank bottom wall 3a of the coolant tank 3. Since this heat evaporates and boils the condensate into vapor, the heat of the server 2 is removed and the server 2 is cooled. The gas-phase coolant C which becomes vapor moves above the liquid surface of the coolant C and is introduced into the heat pipe 10 from the lower end of the heat pipe 10. The coolant C which is introduced into the heat pipe 10 as vapor moves upward inside the heat pipe 10. Then, when the coolant C reaches the upper end of the heat pipe 10, the coolant turns downward according to the concave curved surface of the upper end. Accordingly, the coolant C moves downward along the inner surface of the heat pipe 10.

When the coolant C moves along the inner surface of the heat pipe 10, the coolant exchanges heat with the air blown by the blower fan 27 via the plate-shaped fins 20 and the inner surface of the heat pipe 10. Accordingly, since the heat of the coolant C is taken away, the coolant C undergoes a phase change from a gas phase to a liquid phase, becomes condensed water, and drips downward in the coolant tank 3. In this way, in the first cooling system 1, since the coolant C circulates inside the coolant tank 3 and the heat pipe 10, the heat of the server 2 is released to the outside. Accordingly, the server 2 can be continuously cooled without requiring power of a pump or the like for circulating the coolant C.

Here, in this embodiment, as shown in FIG. 3, the horizontal cross-sectional shape of each heat pipe 10 has a flat shape with the leading edge 11 on the upstream side and the trailing edge 12 on the downstream side in the blowing direction of the blower fan 27. Accordingly, air pressure loss on the outer surface of each heat pipe 10 can be reduced and air can be appropriately blown also to the heat pipes 10 located on the downstream side of the blowing direction.

Further, heat exchange between the blown air and the coolant C inside the heat pipe 10 is actively performed on the side of the leading edge 11 of the heat pipe 10. On the other hand, the heat transfer rate between the heat pipe 10 and the air decreases as a result of the air separating from the outer surface of the heat pipe 10 on the side of the trailing edge 12 of the heat pipe 10. Therefore, heat exchange between the blown air and the coolant C inside the heat pipe 10 is less performed on the side of the trailing edge 12 of the heat pipe 10 than on the side of the leading edge 11 thereof. That is, cooling by air is promoted on the side of the leading edge 11 of the heat pipe 10 and cooling by air is inhibited on the side of the trailing edge 12.

Figure 4:
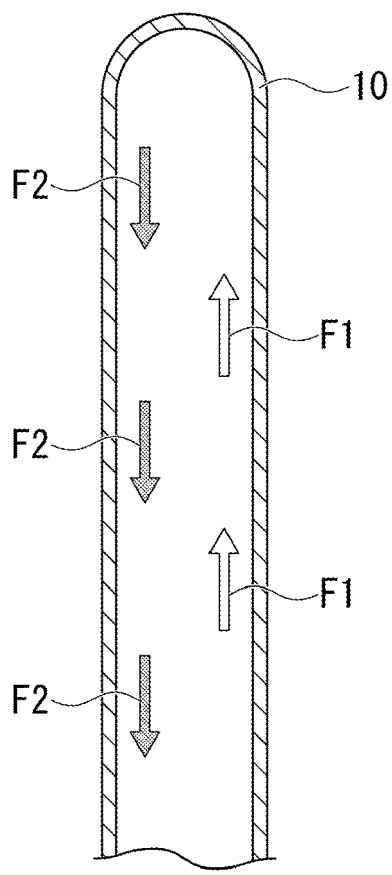
FIG. 4 is a longitudinal sectional view of the heat pipe of the first cooling system according to the first embodiment of the present disclosure and is a diagram illustrating a flow of coolant.

Therefore, as shown in FIGS. 3 and 4, condensation of the coolant C is inhibited to form a gas-phase flow F1 that is a flow of the coolant C as a gas phase in an area on the side of the trailing edge 12 inside the heat pipe 10. On the other hand, condensation of the coolant C is promoted to form a liquid-phase flow F2 that is a flow of condensed water in an area on the side of the leading edge 11 inside the heat pipe 10.

In this way, the upward gas-phase flow F1 is dominant in an area on the side of the trailing edge 12 inside the heat pipe 10 and the downward liquid-phase flow F2 is dominant in an area on the side of the leading edge 11. As a result, the passages of the gas-phase flow F1 and the liquid-phase flow F2 can be separated inside the heat pipe 10 and the interference between the gas-phase flow F1 and the liquid-phase flow F2 can be suppressed. Accordingly, heat can be efficiently transferred by the heat pipe 10 and the cooling efficiency of the server 2 can be improved.

Additionally, in this embodiment, although the inside of the heat pipe 10 is simply hollow and no wick is provided to facilitate movement of condensed water by capillary action, a wick may be provided inside the heat pipe 10. In this case, a wick may be provided in an area on the side of the leading edge 11 inside the heat pipe 10.

First Modified Example of First Embodiment

Figure 5:
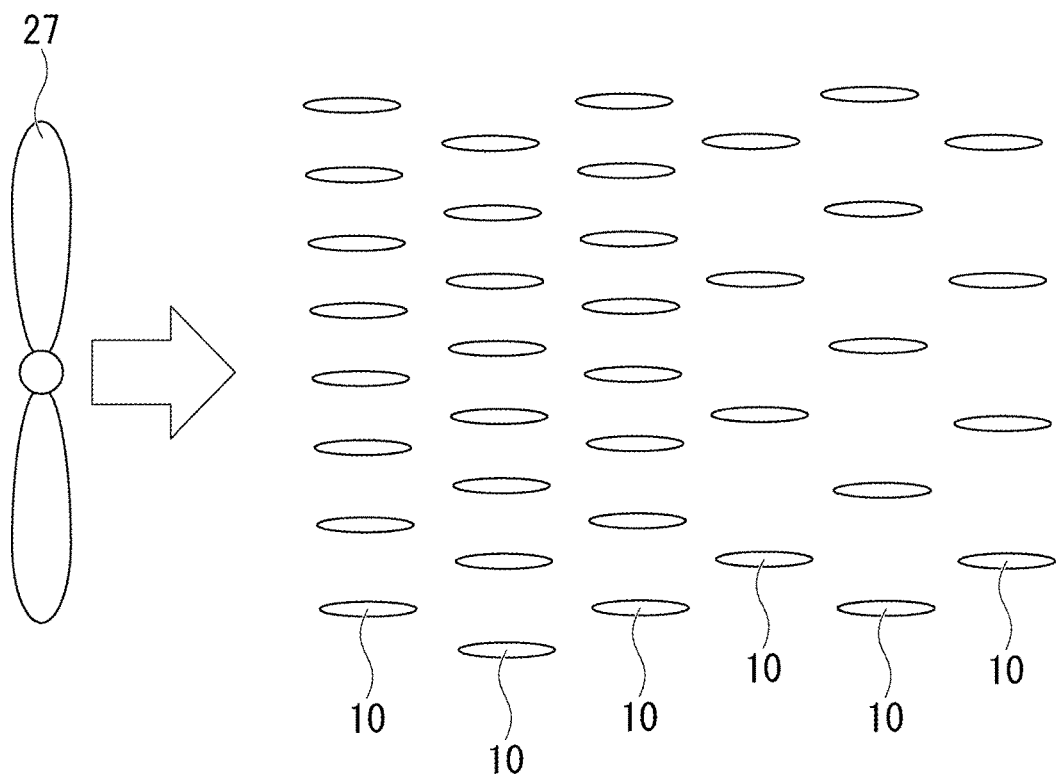
FIG. 5 is a schematic horizontal cross-sectional view of a heat pipe group of a first modified example of the first embodiment of the present disclosure.

As shown in FIG. 5, the plurality of heat pipes 10 may be arranged more densely on the upstream side and arranged more sparsely on the downstream side. That is, the interval between adjacent heat pipes 10 may be relatively small in the upstream portion of the group of heat pipes 10 and the interval between adjacent heat pipes 10 may be relatively large in the downstream portion of the group of the heat pipes 10.

In general, the air density decreases and the volumetric flow rate increases on the downstream side where the air temperature rises. Therefore, the pressure loss can be optimized by arranging the groups of heat pipes 10 more sparingly toward the downstream side.

Additionally, for example, the heat pipes 10 on the downstream side may be thinner than the heat pipes 10 on the upstream side so that the heat pipes 10 on the downstream side become more sparse. Even with this configuration, the same effect as described above can also be obtained.

Second Modified Example of First Embodiment

Figure 6:
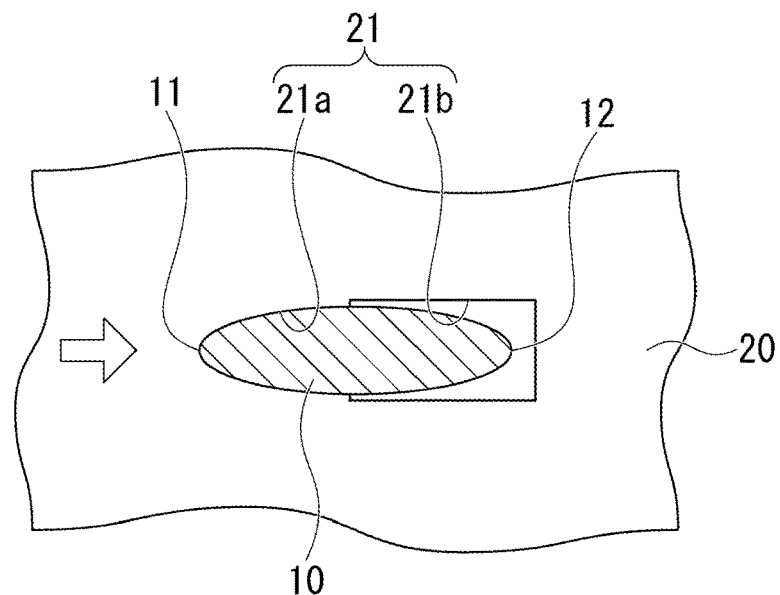
FIG. 6 is a horizontal cross-sectional view of a heat pipe of a second modified example of the first embodiment of the present disclosure.

As shown in FIG. 6, a portion of the outer surface of the heat pipe 10 on the side of the leading edge 11 including the leading edge 11 may be brought into contact with the plate-shaped fins 20 and a portion of the outer surface of the heat pipe 10 on the side of the trailing edge 12 including the trailing edge 12 may be out of contact with the plate-shaped fins 20.

That is, an upstream portion of an inner peripheral edge portion of a through hole 21 through which the heat pipe 10 penetrates in the plate-shaped fin 20 is formed as a contact edge portion 21a having a shape matching the outer surface of the heat pipe 10. On the other hand, a downstream portion of the inner peripheral edge of the through hole 21 is, for example, cut into a rectangular shape. Accordingly, the downstream portion of the inner peripheral edge of the through hole 21 is formed as a contacted edge portion 21b that does not contact the outer surface of the heat pipe 10.

With this configuration, the cooling can be further accelerated and the condensation of the coolant C can be promoted in a portion on the side of the leading edge 11 of the heat pipe 10 that contacts the plate-shaped fin 20. On the other hand, condensation of the coolant C can be inhibited by inhibiting cooling in the portion on the side of the trailing edge 12 of the heat pipe 10 that does not contact the plate-shaped fins 20. Accordingly, as in the first embodiment, the circulation areas of the gas-phase flow F1 and the liquid-phase flow F2 of the coolant C can be appropriately separated and the heat transfer efficiency can be further improved.

Third Modified Example of First Embodiment

Figure 7:
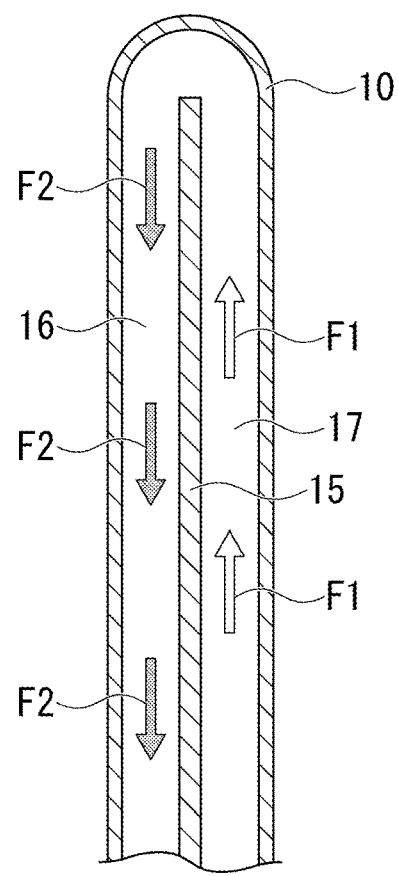
FIG. 7 is a longitudinal sectional view of a heat pipe of a third modified example of the first embodiment of the present disclosure.

As shown in FIG. 7, a partition portion 15 may be provided to separate the passage in each heat pipe 10 into an upstream leading edge passage 16 and a downstream trailing edge passage 17. The upper end of the partition portion 15 does not contact the upper end of the inner surface of the heat pipe 10. Therefore, the leading edge passage 16 and the trailing edge passage 17 communicate with each other at the upper end of the passage of the heat pipe 10.

Even with this configuration, the circulation areas of the gas-phase flow F1 and the liquid-phase flow F2 of the coolant C can be appropriately separated and the heat transfer efficiency can be further improved.

Fourth Modified Example of First Embodiment

Figure 8:
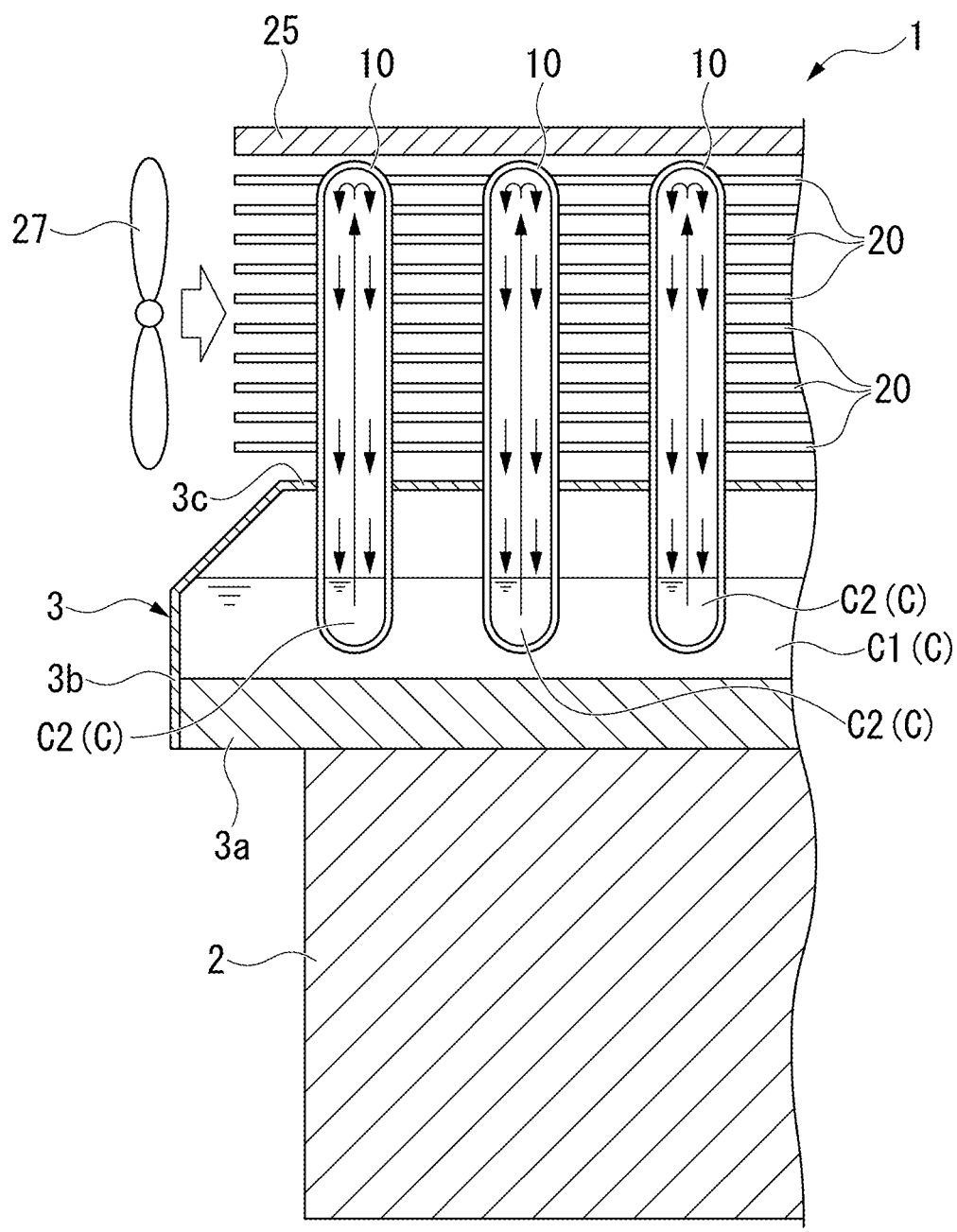
FIG. 8 is a longitudinal sectional view showing an overall configuration of a fourth modified example of the first embodiment of the present disclosure.

For example, as shown in FIG. 8, the lower end of the heat pipe 10 (the end on the inside of the coolant tank 3) may be closed as in the upper end of the heat pipe 10 (the end on the outside of the coolant tank 3) and may be extended downward in the coolant tank 3 to be immersed in the liquid-phase coolant C. In this case, the coolant C (first coolant C1) stored in the coolant tank 3 may be different from the coolant C (second coolant C2) stored in the heat pipe 10.

According to this configuration, the first coolant C1 which becomes vapor due to the heat of the server 2 is condensed by exchanging heat with the second coolant C2 as a condensed liquid in the heat pipe 10. After taking heat away from the first coolant C1, the second coolant C2 in the heat pipe 10 moves upward as vapor, exchanges heat with the outside air, condenses, and flows downward.

Even with this configuration, as in the first embodiment, the server 2 can be continuously cooled by the circulation of the first coolant C1 and the second coolant C2 without requiring power of a pump or the like.

Further, since the coolant C suitable for the temperature of the server 2 and the outside air can be selected, the heat exchange efficiency can be further improved.

Additionally, in the first embodiment, the heat pipe 10 may extend toward the outside of the coolant tank 3, that is, in a direction away from the coolant tank 3. For example, the heat pipe 10 may extend horizontally or obliquely upward. In this case, the plurality of heat pipes 10 may be arranged in the vertical direction. Air may be blown in the vertical direction by the blower fan 27.

Second Embodiment

Figure 9:
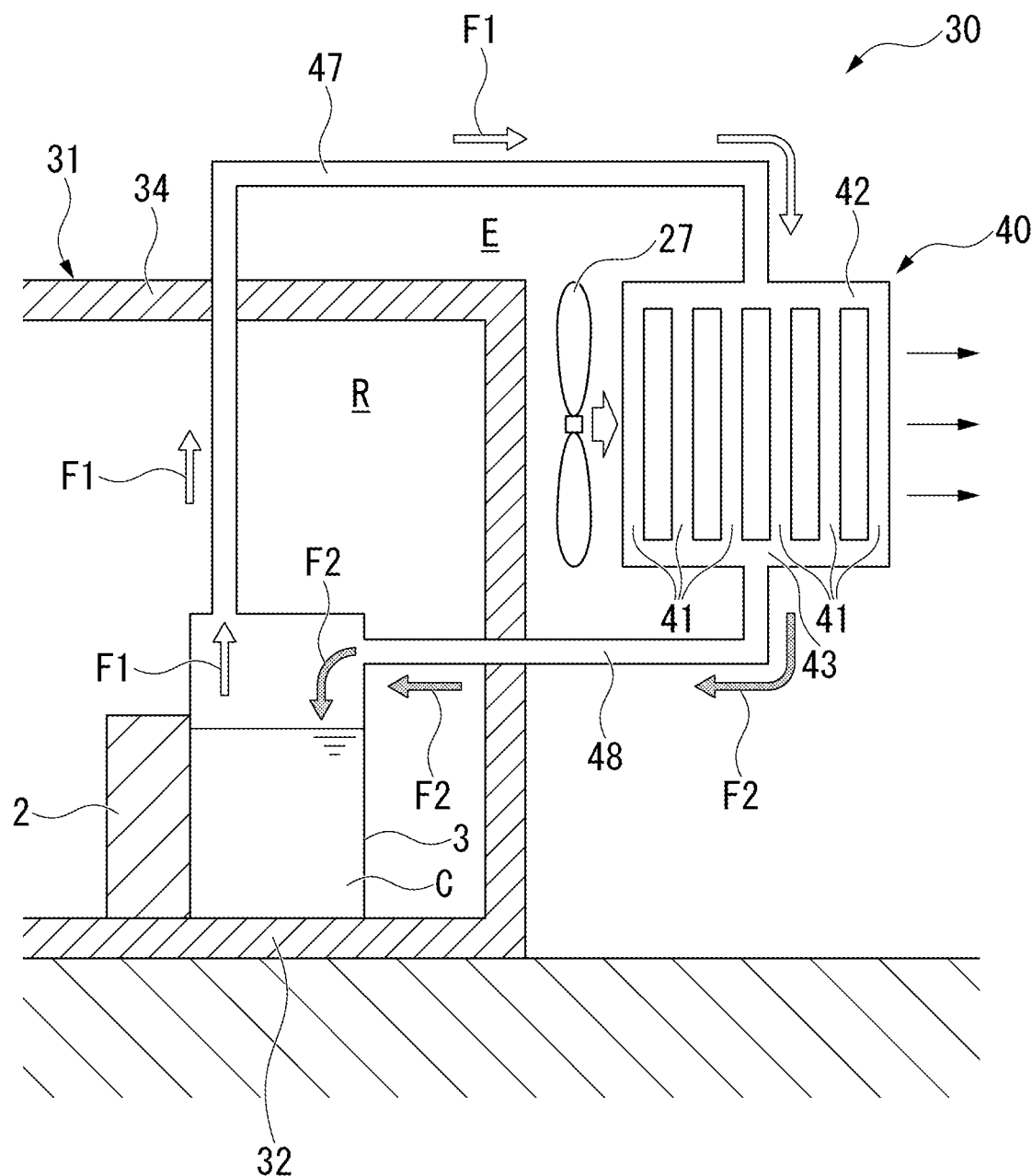
FIG. 9 is a schematic overall configuration diagram of a second cooling system according to a second embodiment of the present disclosure.

Next, a second embodiment of the present invention will be described with reference to FIG. 9. In the second embodiment, the same reference numerals are assigned to the same components as those of the first embodiment, and detailed description thereof is omitted.

(Second Cooling System)

A second cooling system 30 according to the second embodiment is a system that cools the server 2 as in the first embodiment. The second cooling system 30 includes a container 31, the server 2, the coolant tank 3, a heat exchanger 40, a gas-phase pipe 47, a liquid-phase pipe 48, and the blower fan 27.

(Container)

The container 31 has a rectangular parallelepiped box shape that defines a living room or equipment room therein. The container 31 includes a bottom wall 32 which extends in the horizontal direction and is installed on the floor surface or the ground, a side wall 33 which rises upward from the bottom wall 32, and a top wall 34 which contacts the upper end of the side wall 33 and closes the inside of the container 31 from above. That is, the container 31 includes an outer wall composed of the bottom wall 32, the side wall 33, and the top wall 34. The inside of the container 31 is formed as an indoor R, and the outer side of the container 31 is formed as an outdoor E.

(Server and Coolant Tank)

The server 2 and the coolant tank 3 are installed inside the container 31. In this embodiment, the coolant tank 3 is installed to contact the side of the server 2. The coolant C is stored in a closed space inside the coolant tank 3. The coolant C removes heat from the server 2 through a contact portion between the server 2 and the coolant tank 3.

(Heat Exchanger)

The heat exchanger 40 is installed above the coolant tank 3 in the outdoor E. The heat exchanger 40 exchanges heat between the coolant C and the outside air. The heat exchanger 40 includes an external heat transfer pipe 41, an upstream header 42, and a downstream header 43.

The external heat transfer pipe 41 has, for example, a tubular shape extending in the vertical direction and a plurality of the external heat transfer pipes 41 are arranged side by side at intervals in the horizontal direction. The inside of each external heat transfer pipe 41 is the passage of the coolant C extending in the vertical direction. In the passage of the coolant C, the upper side is the upstream side and the lower side is the downstream side.

The upstream header 42 and the downstream header 43 extend in the horizontal direction and are formed to be hollow.

The upstream header 42 is disposed above the plurality of external heat transfer pipes 41. The inside of the upstream header 42 communicates with the upper end of each external heat transfer pipe 41. That is, the upstream header 42 connects the upper ends of the plurality of external heat transfer pipes 41.

The downstream header 43 is disposed below the plurality of external heat transfer pipes 41. The inside of the downstream header 43 communicates with the lower end of each external heat transfer pipe 41. That is, the downstream header 43 connects the lower ends of the plurality of external heat transfer pipes 41.

(Gas-Phase Pipe)

The gas-phase pipe 47 connects the coolant tank 3 and the upstream header 42 of the heat exchanger 40. One end which is the upstream end of the gas-phase pipe 47 is connected to the upper end of the coolant tank 3 to communicate with the inside of the coolant tank 3. The other end which is the downstream end of the gas-phase pipe 47 is connected to the inside of the upstream header 42 in a communication state.

(Liquid-Phase Pipe)

The liquid-phase pipe 48 connects the downstream header 43 of the heat exchanger 40 and the coolant tank 3. On end which is the upstream end of the liquid-phase pipe 48 is connected to the downstream header 43 from below. One end of the liquid-phase pipe 48 communicates with the inside of the downstream header 43. The gas-phase pipe 47 extends downward and horizontally from one end and the other end which is another end is connected to the coolant tank 3 in a communication state.

(Blower Fan)

The blower fan 27 blows air to the plurality of external heat transfer pipes 41 of the heat exchanger 40 to cool the external heat transfer pipe 41 and the coolant C flowing through the external heat transfer pipe 41.

(Operation and Effect of Second Embodiment)

The liquid-phase coolant C in the coolant tank 3 cools the server 2 by taking heat away from the server 2. At this time, the coolant C evaporates and boils to become vapor, that is, the gas-phase coolant C. The gas-phase coolant C is introduced into the gas-phase pipe 47 and is guided to the heat exchanger 40 in the outdoor E as the gas-phase flow F1 in the gas-phase pipe 47. The coolant C reaching the heat exchanger 40 as the gas-phase flow F1 is introduced into each external heat transfer pipe 41 through the upstream header 42.

The coolant C is cooled and condensed by exchanging heat with the air blown by the blower fan 27 in the process of flowing through the external heat transfer pipe 41 from above to below. Accordingly, the coolant C flows as the liquid-phase flow F2 of condensed water through the downstream header 43 and the liquid-phase pipe 48 according to gravity and is returned to the coolant tank 3.

As described above, the second cooling system 30 of the second embodiment constitutes a loop-type thermosiphon heat pipe that does not require a pump or the like for circulating the coolant C. Accordingly, the server 2 can be cooled continuously without requiring external power.

First Modified Example of Second Embodiment 1

Figure 10:
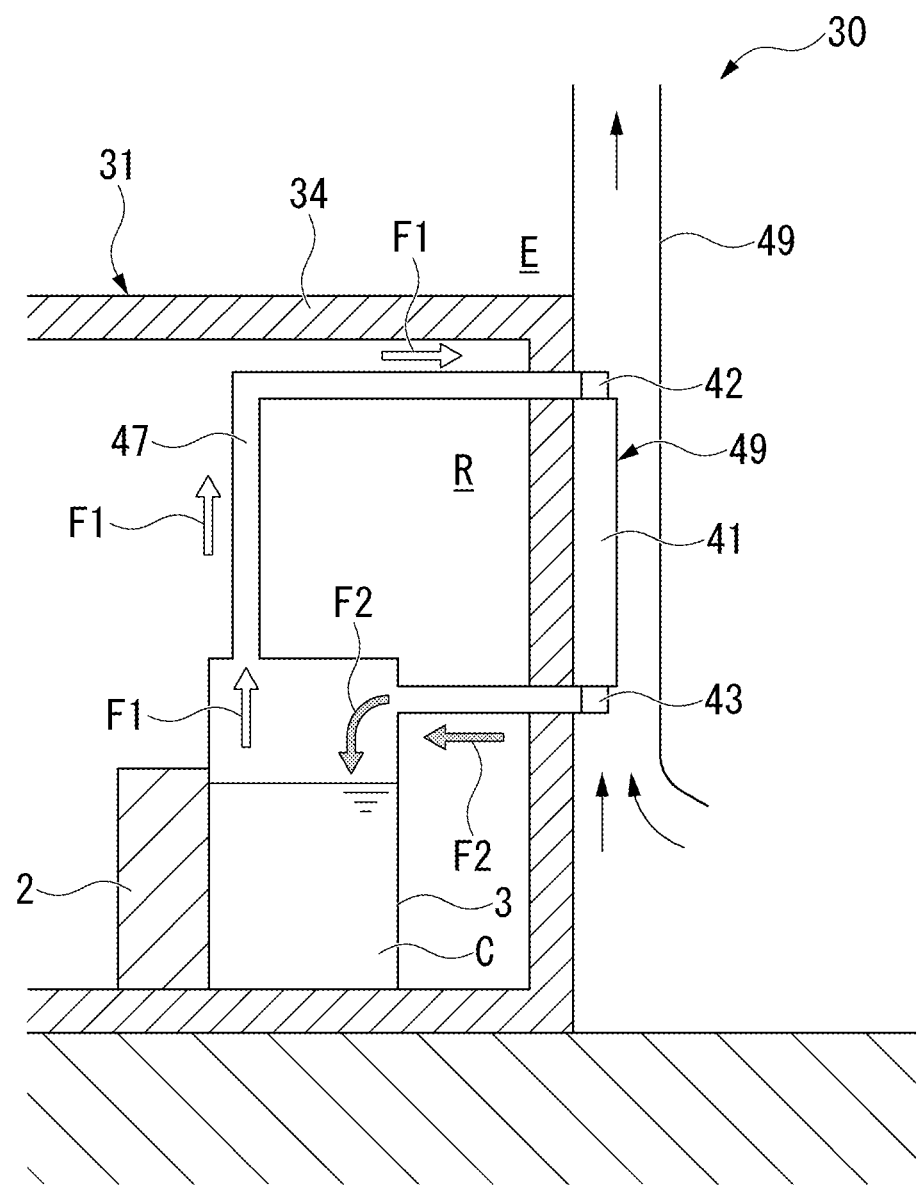
FIG. 10 is a schematic overall configuration diagram of a first modified example of the second embodiment of the present disclosure.

For example, as shown in FIG. 10, a duct forming portion 49 storing the heat exchanger 40 may be provided on the outer wall of the container 31. The duct forming portion 49 forms a duct that extends in the vertical direction along the outer wall of the container 31 and has open upper and lower ends.

Figure 11:
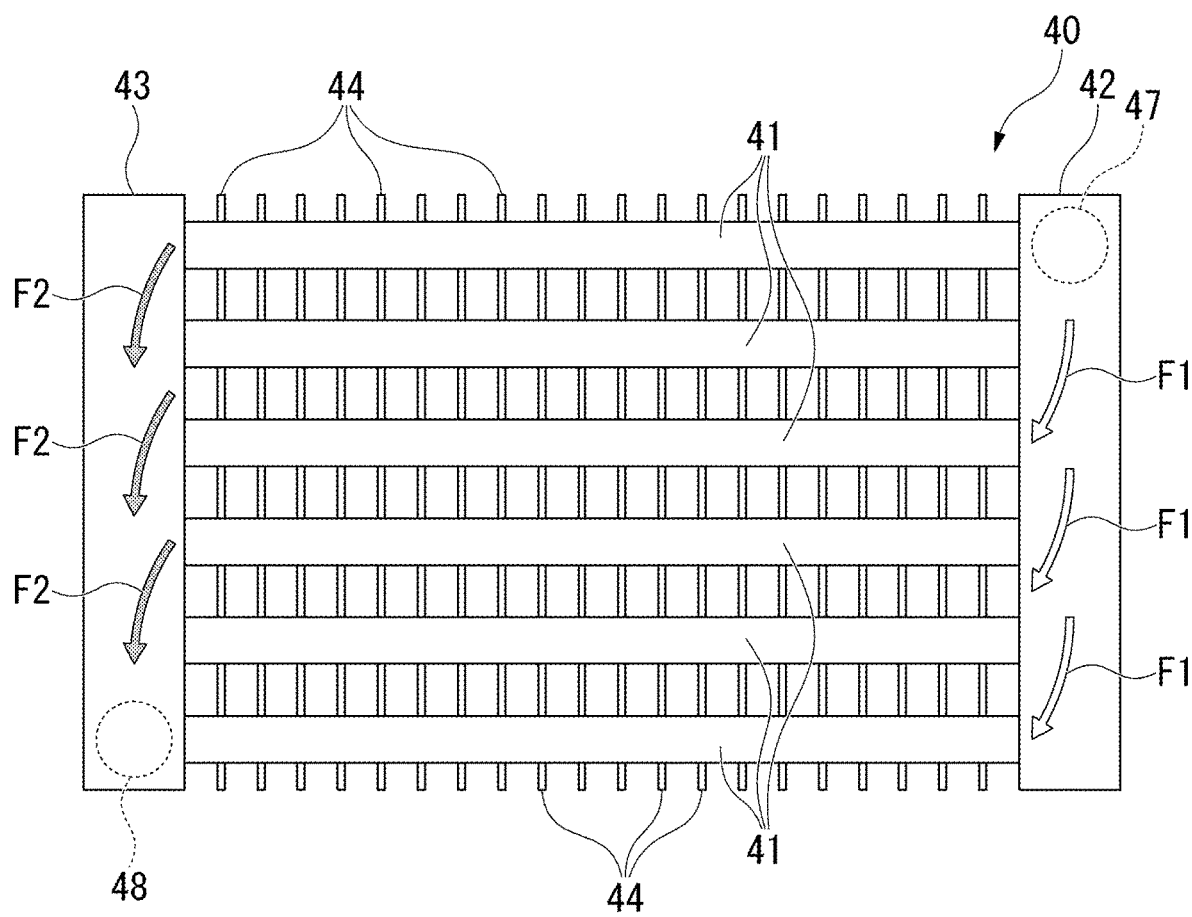
FIG. 11 is a diagram showing a configuration of a heat exchanger of the first modified example of the second embodiment of the present disclosure.

In this case, as shown in FIG. 11, the external heat transfer pipes 41 of the heat exchanger 40 may be arranged to extend in the horizontal direction and may be arranged side by side in the vertical direction and the upstream header 42 and the downstream header 43 may be provided on both sides in the horizontal direction. Each external heat transfer pipe 41 may be provided with a plurality of external fins 44 contacting the outer peripheral surface of the external heat transfer pipe 41.

According to this configuration, the introduction of the high-temperature coolant C into the heat exchanger 40 causes an upward airflow in the duct. As a result, a continuous air flow is formed from the lower end to the upper end of the duct. Accordingly, it is possible to more efficiently perform cooling of the coolant C in the heat exchanger 40 and to more efficiently perform cooling of the server 2.

Second Modified Example of Second Embodiment

Figure 12:
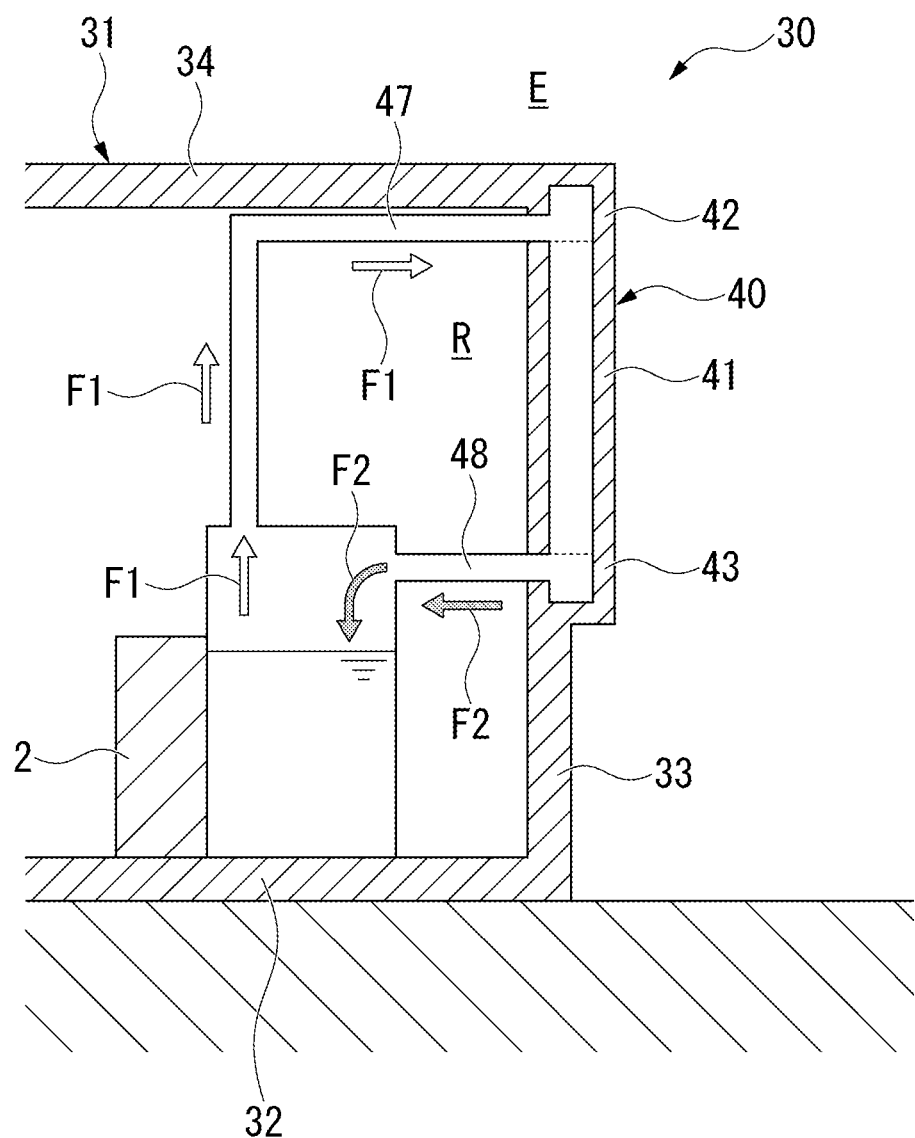
FIG. 12 is a schematic overall configuration diagram of a second modified example of the second embodiment of the present disclosure.

For example, as shown in FIG. 12, the heat exchanger 40 may be provided integrally with the outer wall of the container 31 along the outer surface of the outer wall. In this case, the plurality of external heat transfer pipes 41 are arranged along the outer wall, and the upstream header 42 and the downstream header 43 connecting them are also arranged along the outer wall.

Since the heat exchanger 40 is provided integrally with the outer wall itself of the container 31 in this way, there is no need to separately ensure a storage space for the heat exchanger 40 and a compact configuration can be realized as a whole. Further, since the outer wall itself can be used as a heat radiating portion, it is possible to further promote heat exchange between the coolant C and the outside air in the heat exchanger 40 and to improve the condensation performance of the coolant C. As a result, it is possible to more efficiently perform cooling of the server 2.

Third Embodiment

Next, a second embodiment of the present invention will be described with reference to FIG. 13. In the third embodiment, the same reference numerals are assigned to the same components as those of the other embodiments, and detailed description thereof is omitted.

(Third Cooling System)

Figure 13:
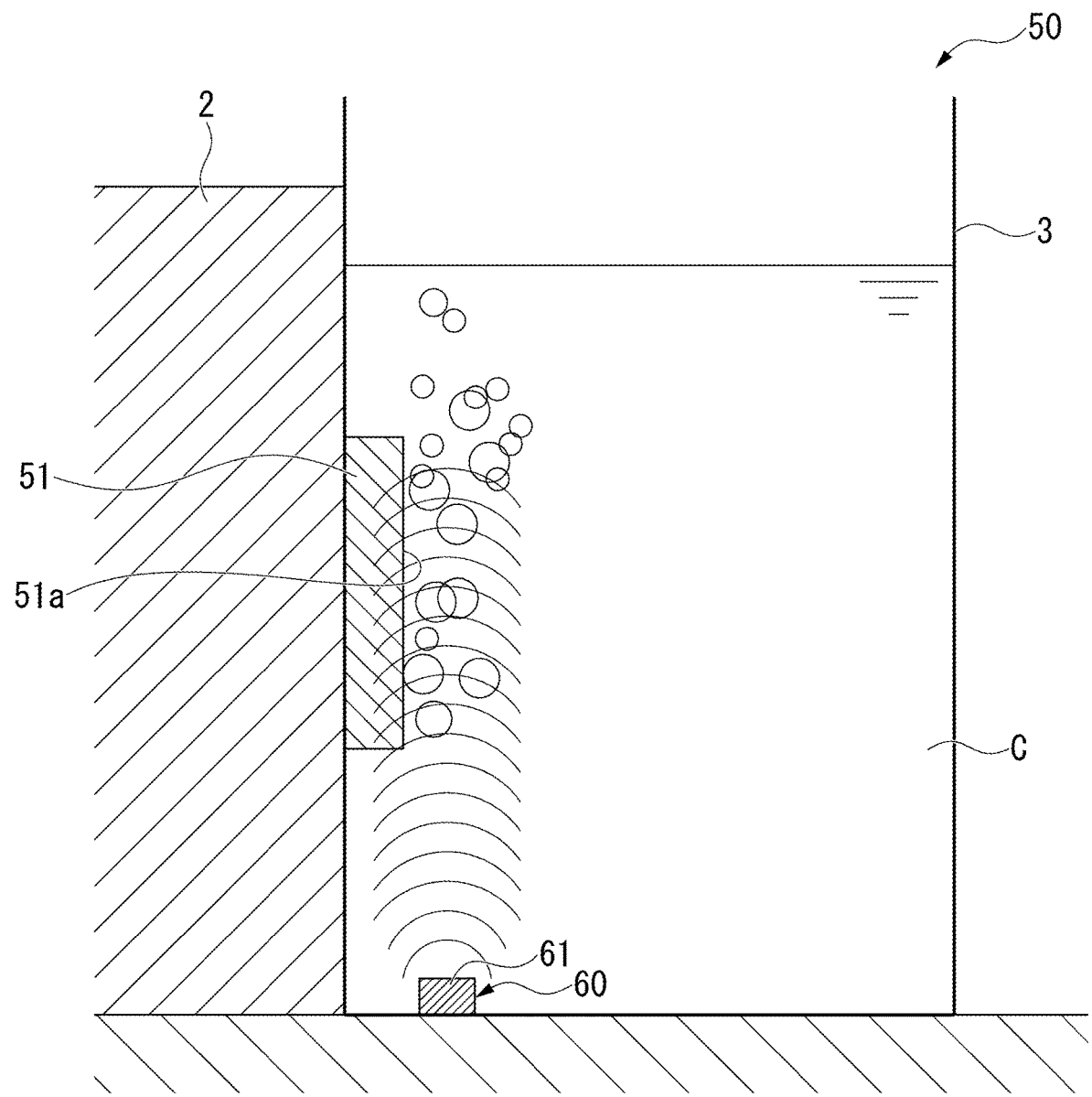
FIG. 13 is a schematic overall configuration diagram of a third cooling system according to a third embodiment of the present disclosure.

As shown in FIG. 13, a third cooling system 50 of the third embodiment includes the server 2, the coolant tank 3, a heat radiator 51, and a vapor film removing unit 60 which is a heat transfer promoting unit.

The server 2 and the coolant tank 3 have the same configuration as that of the second embodiment. That is, heat is removed from the server 2 by the coolant C inside the coolant tank 3.

(Heat Radiator)

The heat radiator 51 is made of, for example, a material containing metal with high thermal conductivity such as aluminum or copper. The heat radiator 51 is provided in the coolant tank 3 to be immersed in the coolant C in the coolant tank 3. The heat radiator 51 is provided to contact the inner wall surface contacting the server 2 in the coolant tank 3. That is, the heat radiator 51 is in thermal contact with the server 2 through the inner wall surface of the coolant tank 3. The heat radiator 51 has a flat plate shape that extends along the inner wall surface of the coolant tank 3, that is, a plate shape that extends in the vertical direction and the horizontal direction.

One of the pair of plate surfaces of the heat radiator 51 is fixed and integrated with the inner wall surface of the coolant tank 3. The other of the pair of plate surfaces of the heat radiator 51 is a heat radiation surface 51a of the heat radiator 51 and faces the coolant C in the coolant tank 3.

(Vapor Film Removing Unit)

The vapor film removing unit 60 prevents the vapor film of the coolant C from adhering to the heat radiation surface 51a of the heat radiator 51.

(Ultrasonic Generator)

In this embodiment, an ultrasonic generator 61 is adopted as the vapor film removing unit 60. The ultrasonic generator 61 is disposed inside the coolant tank 3 and is installed, for example, just below the heat radiator 51 in the bottom surface of the coolant tank 3. The ultrasonic generator 61 applies ultrasonic waves upward, that is, toward the heat radiation surface 51a of the heat radiator 51. The applied ultrasonic waves are transmitted to the heat radiation surface 51a of the heat radiator 51 through the coolant C as a medium.

Operation and Effect of Third Embodiment

In the above-described third cooling system 50, heat generated from the server 2 is transferred to the heat radiator 51 and is removed by evaporating and boiling of the coolant C on the heat radiation surface 51a of the heat radiator 51. Here, if it becomes a condition exceeding the critical heat flux from the heat radiator 51 to the coolant C when the heat generation density of the server 2 is high, a film (vapor film) of the vapor of the coolant C is formed on the entire heat radiation surface 51a of the heat radiator 51. When such a vapor film is formed, the heat transfer rate from the heat radiator 51 to the coolant C is rapidly lowered, and heat may not be sufficiently radiated from the heat radiator 51.

On the other hand, in this embodiment, even when a vapor film is formed on the heat radiation surface 51a of the heat radiator 51, the vapor film can be removed in such a manner that the ultrasonic generator 61 which is the vapor film removing unit 60 applies ultrasonic waves to the heat radiation surface 51a of the radiator 51. That is, the vapor film can be made finer and collapsed by applying ultrasonic waves to the heat radiation surface 51a of the heat radiator 51. Accordingly, since the coolant C can come into direct contact with the heat radiation surface 51a of the heat radiator 51, heat can be effectively removed from the heat radiator 51 by the coolant C. Accordingly, cooling of the server 2 can be performed more effectively.

Further, since the vapor film on the heat radiation surface 51a can be removed by the vapor film removing unit 60, the critical heat flux can be increased. If the critical heat flux is improved, it is possible to operate the coolant C at a higher temperature. Accordingly, since the temperature difference between the coolant C and the atmosphere can be increased, the size of the device that cools the coolant C can be made compact. Further, waste heat recovery from the coolant C becomes easy, and heat recovery can be effectively performed by using, for example, an organic Rankine cycle.

First Modified Example of Third Embodiment

Figure 14:
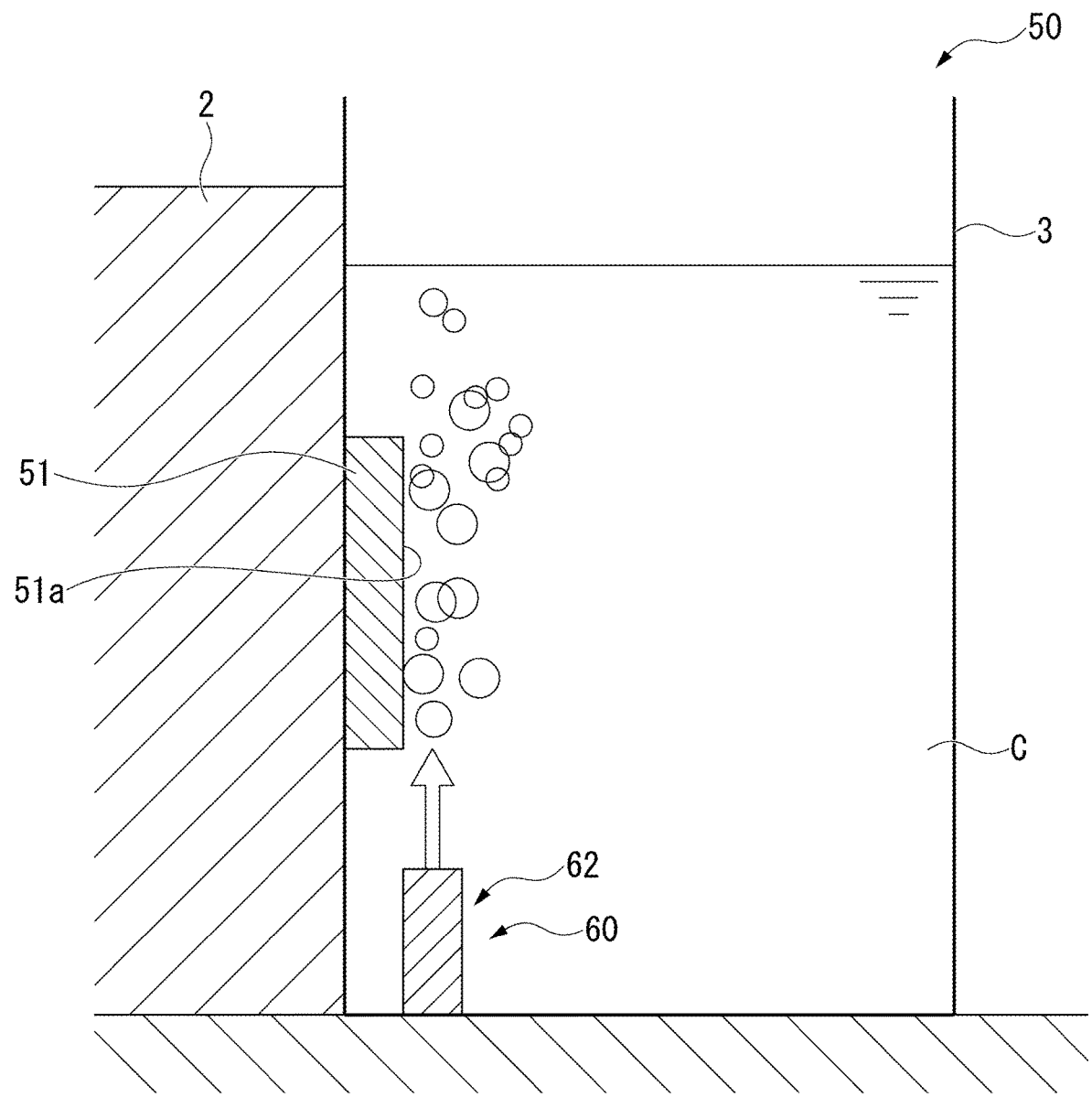
FIG. 14 is a schematic overall configuration diagram of a first modified example of the third embodiment of the present disclosure.

For example, as shown in FIG. 14, a jet injector 62 may be adopted as the vapor film removing unit 60. The jet injector 62 supplies a jet stream of the coolant C from directly below the heat radiation surface 51a in the coolant tank 3 to the heat radiation surface 51a. That is, the jet stream is injected along the heat radiation surface 51a.

Accordingly, as in the third embodiment, the vapor film can be easily removed from the heat radiation surface 51a.

Second Modified Example of Third Embodiment

Figure 15:
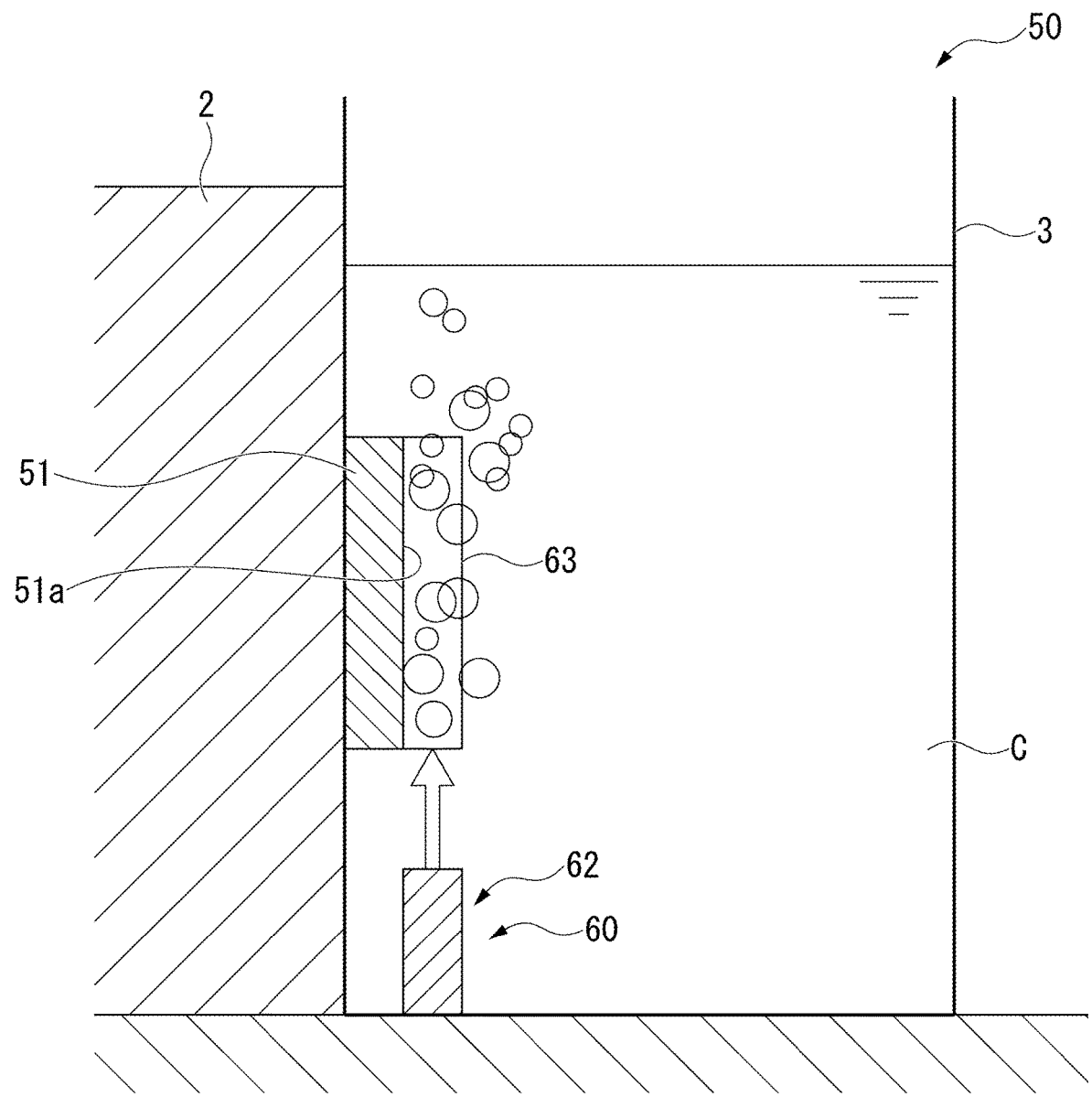
FIG. 15 is a schematic overall configuration diagram of a second modified example of the third embodiment of the present disclosure.

For example, as shown in FIG. 15, a flow path forming portion 63 may be formed on the heat radiation surface 51a in addition to the jet injector 62. As the flow path forming portion 63, for example, a fin-shaped structure rising from the heat radiation surface 51a and extending in the vertical direction or a cover-shaped member such as the cover 25 forming the flow path extending in the vertical direction on the heat radiation surface 51a can be used. Accordingly, a jet stream can be locally supplied from the jet injector 62 along the surface of the heat radiation surface 51a and the vapor film can be easily removed. Further, heat exchange between the coolant C as a jet stream and the heat radiation surface 51a can be promoted, and heat can be removed from the server 2 more effectively.

Third Modified Example of Third Embodiment

Figure 16:
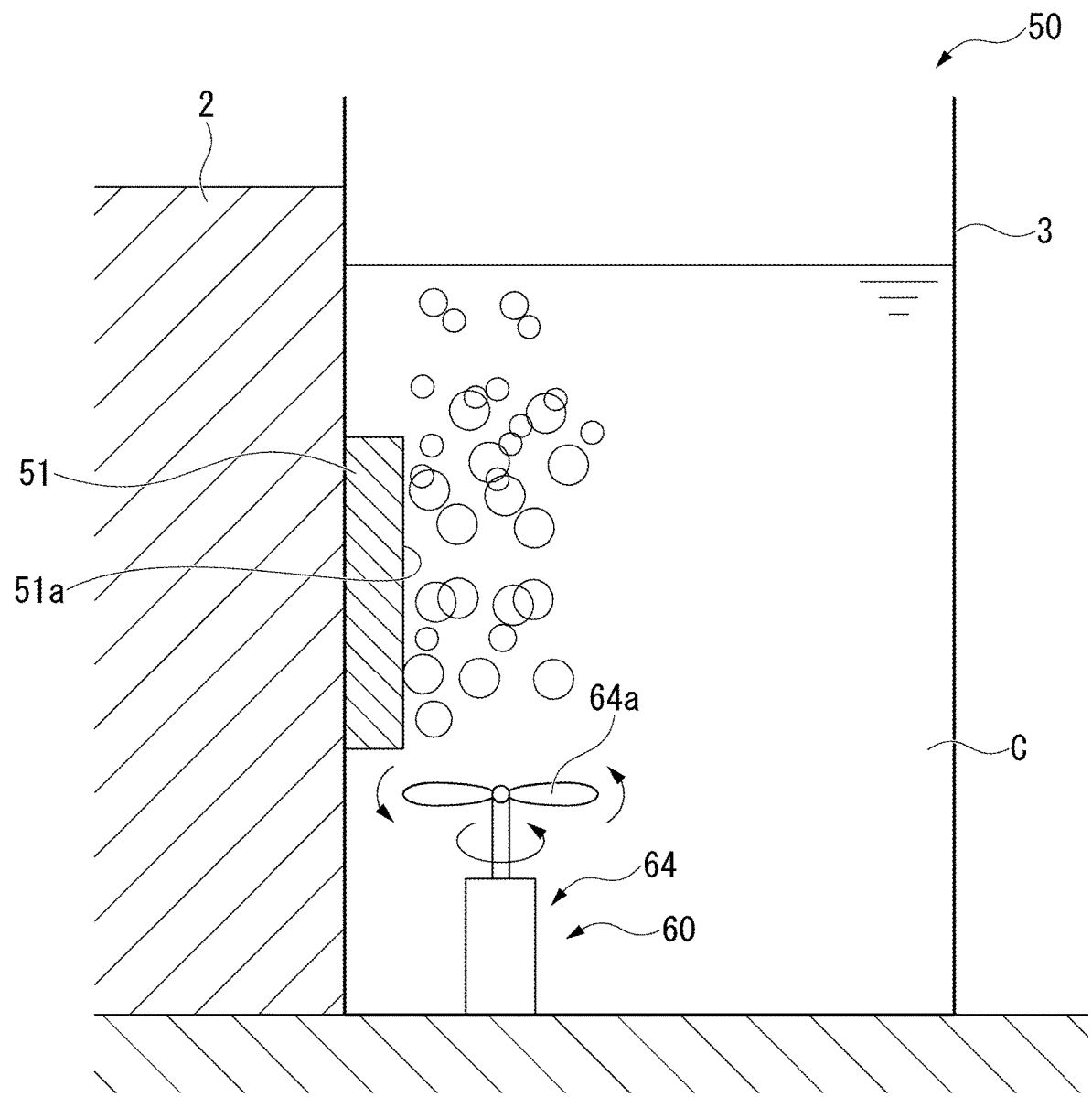
FIG. 16 is a schematic overall configuration diagram of a third modified example of the third embodiment of the present disclosure.

For example, as shown in FIG. 16, a swirling flow generator 64 may be adopted as the vapor film removing unit 60.

The swirling flow generator 64 includes a propeller 64a which is rotatable around an axis extending vertically just below the heat radiation surface 51a. It is possible to easily remove the vapor film of the heat radiation surface 51a by supplying a swirling flow around the vertical axis O to the heat radiation surface 51a by the propeller 64a and to more easily remove the heat of the server 2 by promoting the heat exchange between the coolant C as a swirling flow and the heat radiation surface 51a.

Fourth Modified Example of Third Embodiment

Figure 17:
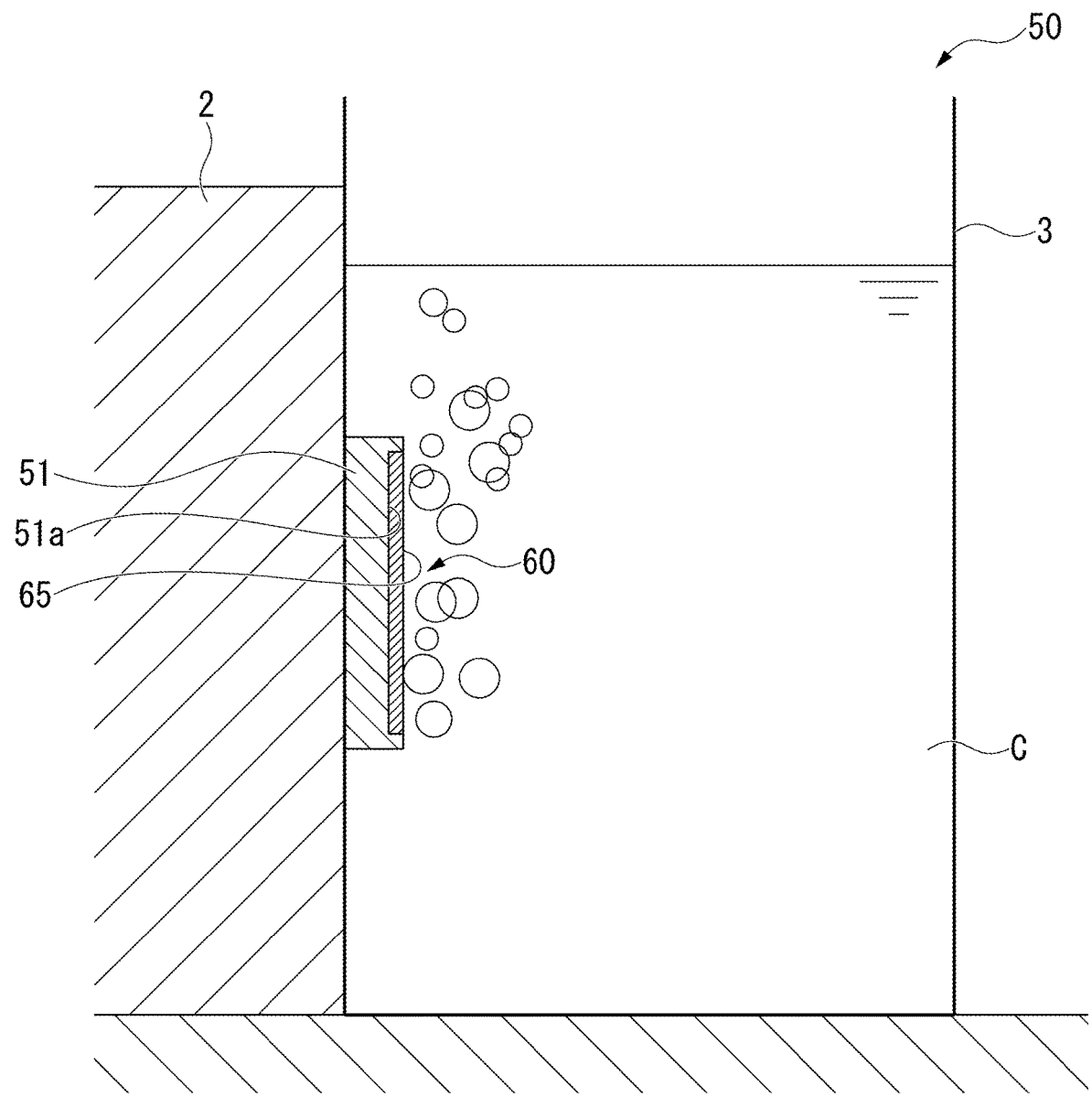
FIG. 17 is a schematic overall configuration diagram of a fourth modified example of the third embodiment of the present disclosure.

For example, as shown in FIG. 17, a binder 65 may be provided along the heat radiation surface 51a as the vapor film removing unit 60. The binder 65 can be made of, for example, fibers with high thermal conductivity and other materials such as metals. As the binder 65, for example, a composite of carbon fiber and aluminum or copper may be used.

Since the binder 65 having higher thermal conductivity than the heat radiator 51 is provided on the heat radiation surface 51a of the heat radiator 51, the critical heat flux between the heat radiator 51 and the coolant C can be increased. Accordingly, the above-described advantages can be obtained.

Fourth Modified Example of Third Embodiment

Figure 18:
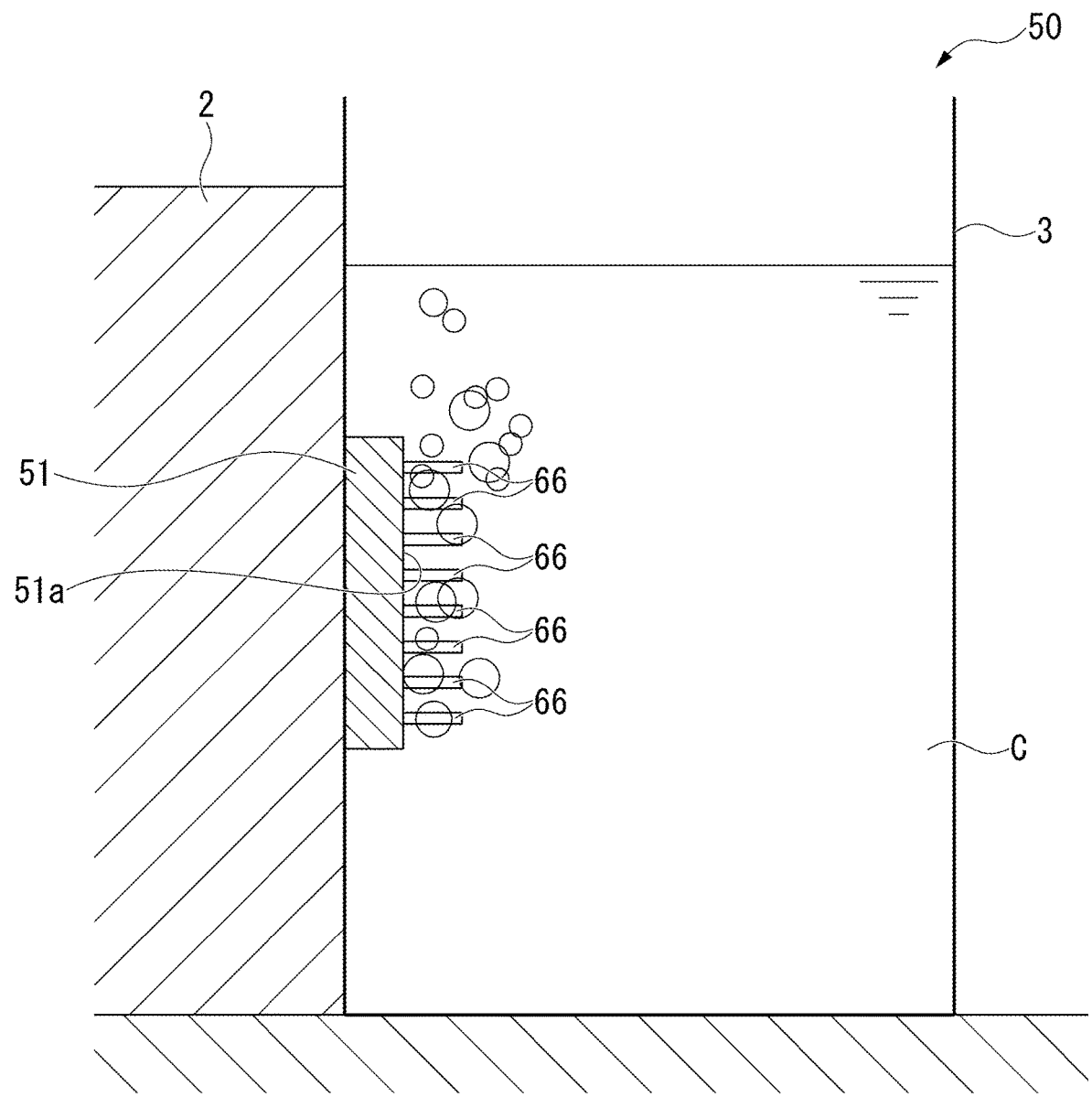
FIG. 18 is a schematic overall configuration diagram of a fifth modified example of the third embodiment of the present disclosure.

For example, as shown in FIG. 18, a plurality of fins rising from the heat radiation surface 51a of the heat radiator 51 may be provided on the heat radiation surface 51a as the vapor film removing unit 60. The fins are made of the same material as the heat radiator 51. Accordingly, the area of the heat radiation surface 51a can be increased and the critical heat flux can be increased.

Additionally, when the heat radiator 51 is provided with fins, the binder 65 may be interposed between the fins and the heat radiator 51. Accordingly, the heat resistance at the joint surface between the fins and the heat radiator 51 can be reduced and the same effect as in the case in which the binder 65 is provided can be obtained.

Other Modified Examples of Third Embodiment

Further, in the third embodiment and the modified examples thereof, although an example has been described in which the vapor film removing unit 60 is provided as the heat transfer promoting unit, the present invention is not limited thereto. Even when the vapor film is not formed on the heat radiation surface 51a of the heat radiator 51, the flow of the coolant C along the heat radiation surface 51a can be disturbed by using each configuration of the vapor film removing unit 60 having the above-described configuration as the heat transfer promoting unit. Accordingly, since the heat transfer rate of the heat radiation surface 51a can be increased, it is possible to more efficiently perform cooling of the server. In addition, since the temperature unevenness is reduced, it is possible to appropriately manage the operating temperature.

Fourth Embodiment

Next, a fourth embodiment of the present invention will be described with reference to FIGS. 19 to 22.
(Fourth Cooling System)
A fourth cooling system 70 according to the fourth embodiment is used, for example, when cooling the evaporated coolant C by removing heat from the server 2. The fourth cooling system 70 extends vertically along the vertical axis O. The fourth cooling system 70 includes a lower housing 80, an air blower 90, an upper housing 100, a rectifier 110, a water injector 112, and a heat exchange unit 120.
(Lower Housing)
The lower housing 80 is a portion that constitutes the lowest portion of the fourth cooling system 70. The lower housing 80 includes a tubular housing outer peripheral wall 81 which surrounds the vertical axis O. The housing outer peripheral wall 81 has, for example, a rectangular cross-sectional shape perpendicular to the vertical axis O. The upper portion of the housing outer peripheral wall 81 is provided with an outer peripheral opening portion 81a which penetrates the housing outer peripheral wall 81 in the radial direction of the vertical axis O. The outer peripheral opening portion 81a is formed as an air inlet to the fourth cooling system 70.

A housing bottom wall 82 which extends radially inward from the lower end of the housing outer peripheral wall 81 is connected to the lower end of the housing outer peripheral wall 81 over the entire circumference. The housing bottom wall 82 has an annular shape in plan view.

A housing top wall 83 which extends radially inward from the upper end of the housing outer peripheral wall 81 is connected to the upper end of the housing outer peripheral wall 81 over the entire circumference and the housing top wall 83 has an annular shape in plan view and has substantially the same outer shape as that of the housing bottom wall 82 while being parallel thereto. The housing top wall 83 is provided with an upper opening portion 83a which penetrates the housing top wall 83 in the vertical direction. The upper opening portion 83a becomes an air inlet to the fourth cooling system 70.

An inner annular wall 84 and an outer annular wall 85 are provided inside the lower housing 80.

The inner annular wall 84 has a truncated cone shape centered on the vertical axis O and gradually decreasing in diameter from below to above. The lower end of the inner annular wall 84 is connected to the inner peripheral edge of the housing bottom wall 82 over the entire circumference. The upper end of the inner annular wall 84 has substantially the same height as that of the housing top wall 83.

The outer annular wall 85 is disposed on the outer peripheral side of the inner annular wall 84 and has a truncated cone shape centered on the vertical axis O and gradually decreasing in diameter from below to above. The upper end of the outer annular wall 85 is connected to the inner peripheral edge of the housing top wall 83 over the entire circumference. A space between the outer annular wall 85 and the inner annular wall 84 is formed as an air introduction flow path gradually decreasing in diameter from below to above.

The lower housing 80 with such a configuration is supported from below by leg portions 88. That is, the lower housing 80 is installed on the floor surface through the leg portions 88.
(Air Blower)
The air blower 90 includes a drive unit 91, a shaft portion 92, and an impeller 93.

The drive unit 91 is, for example, an electric motor, and is rotationally driven around the vertical axis O by power supplied from the outside. The drive unit 91 is disposed on the radial inside of the inner annular wall 84. That is, the inner annular wall 84 covers the drive unit 91 from the outer peripheral side.

The shaft portion 92 extends upward from the drive unit 91 along the vertical axis O. The shaft portion 92 rotates around the vertical axis O by the driving of the drive unit 91.

The impeller 93 includes a boss portion 94 and a plurality of blades 95. The boss portion 94 is provided integrally with the upper end of the shaft portion 92. The plurality of blades 95 are provided to extend radially outward from the outer peripheral surface of the boss portion 94 and are provided at intervals in the circumferential direction. The plurality of blades 95 are arranged on the outlet side of the introduction flow path formed by the inner annular wall 84 and the outer annular wall 85, that is, just above the introduction flow path. By rotationally driving the drive unit 91, the impeller 93 rotates, and air is blown upward from below.

(Upper Housing)

The upper housing 100 has a tubular shape extending in the vertical direction about an axis. The lower end of the upper housing 100 is fixed to the upper surface of the housing top wall 83 of the lower housing 80 over the entire circumference. The upper housing 100 surrounds the impeller 93 of the air blower 90 from the entire circumference. A clearance is formed between the radially outer end of the impeller 93 and the inner peripheral surface of the upper housing 100. The inner space of the upper housing 100 is formed as an upward flow path for air blown by the air blower 90.

The inner peripheral surface of the upper housing 100 is a first inner peripheral surface 100a that extends upward from the lower end to a predetermined height with a uniform flow path cross-sectional area. A portion above the first inner peripheral surface 100a in the inner peripheral surface of the upper housing 100 is a second inner peripheral surface 100b that gradually increases in diameter upward.

Here, a sound absorbing material is provided on the inner peripheral surface of the upper housing 100 of this embodiment. As the sound absorbing material, for example, an acoustic liner such as an acoustic damper can be adopted. Further, as the sound absorbing material, a porous material, a foam material, or the like may be provided on the inner peripheral surface of the upper housing 100.

(Rectifier)

The rectifier 110 is provided at a height position of the boundary between the first inner peripheral surface 100a and the second inner peripheral surface 100b in the upper housing 100. The rectifier 110 has a flat plate shape perpendicular to the vertical axis O and extends to close the flow path in the upper housing 100. A plurality of rectifying holes 110a penetrating in the vertical direction are arranged in the rectifier 110 at intervals in the horizontal direction.

Additionally, the rectifier 110 may be a honeycomb structure having a certain thickness in the vertical direction and having a plurality of holes penetrating in the vertical direction.

(Water Injector)

A plurality of the water injectors 112 are provided on the inner peripheral surface of the upper housing 100 at intervals in the circumferential direction. The water injector 112 is provided on the first inner peripheral surface 100a below the rectifier 110 inside the upper housing 100. The water injector 112 may be provided on the second inner peripheral surface 100b above the rectifier 110 inside the upper housing 100. Each water injector 112 is configured to inject water radially inward and diagonally upward inside the upper housing 100.

(Heat Exchange Unit)

Next, the heat exchange unit 120 will be described. The heat exchange unit 120 is provided at the uppermost portion of the fourth cooling system 70. The heat exchange unit 120 is integrally fixed to the upper end of the upper housing 100. The heat exchange unit 120 includes a heat transfer pipe group 130, a casing 140, a coolant supply section 180, and a coolant discharge section 190.

(Heat Transfer Pipe Group)

As shown in FIGS. 19 to 22, the heat transfer pipe group 130 is an assembly of the plurality of heat transfer pipes 131. Each heat transfer pipe 131 extends in the vertical direction. The inner space of each heat transfer pipe 131 is formed as an air passage P1 which extends in the vertical direction and has open upper and lower ends.

In the horizontal cross-sectional shape of each heat transfer pipe 131, the inner peripheral surface and the outer peripheral surface have a regular hexagonal shape. The horizontal cross-sectional shape of each heat transfer pipe 131 may be polygonal or circular. The thickness of the heat transfer pipe 131 is formed uniformly over the entire circumference. The inner peripheral surface of each heat transfer pipe 131 is provided with an inner surface fin 131a which protrudes radially inward in the heat transfer pipe 131 from the inner peripheral surface and extends in the entire area in the vertical direction. Each inner surface fin 131a is formed on each of six inner surfaces constituting the inner surface of the heat transfer pipe 131. That is, a plurality of (six in this embodiment) inner surface fins 131a are formed on the inner peripheral surface of the heat transfer pipe 131 at intervals in the circumferential direction.

Such a plurality of heat transfer pipes 131 are collectively provided at equal intervals. The heat transfer pipes 131 adjacent to each other are regularly arranged while the planes forming the outer peripheral surfaces of the pipes 131 face each other. Accordingly, a coolant passage P2 extending in the vertical direction and the horizontal direction is formed between the heat transfer pipes 131. In plan view, the coolant passage P2 is formed in a mesh shape to avoid the regular hexagonal heat transfer pipes 131.

(Casing)

Figure 19:
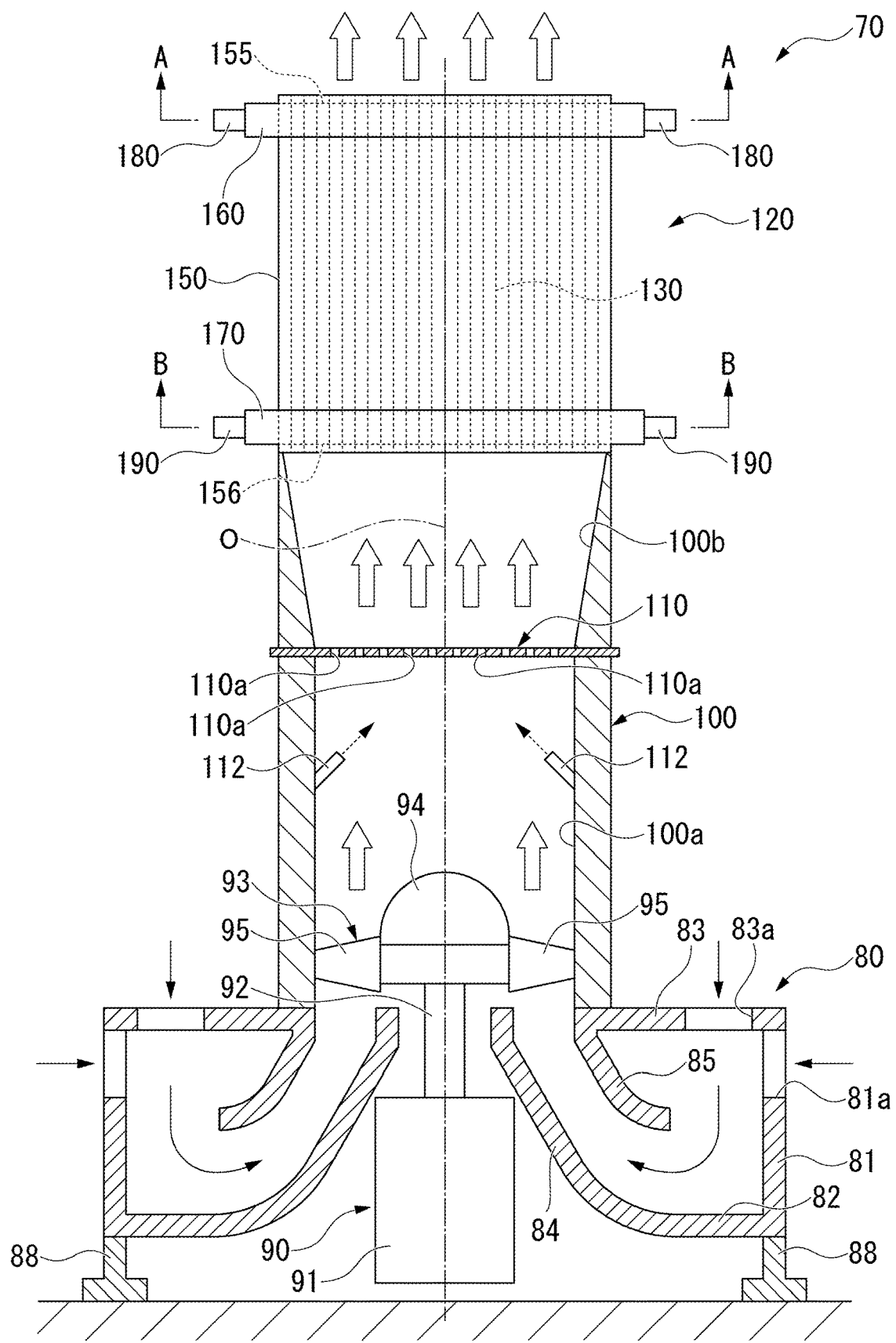
FIG. 19 is a schematic overall configuration diagram of a fourth cooling system according to a fourth embodiment of the present disclosure.
Figure 20:
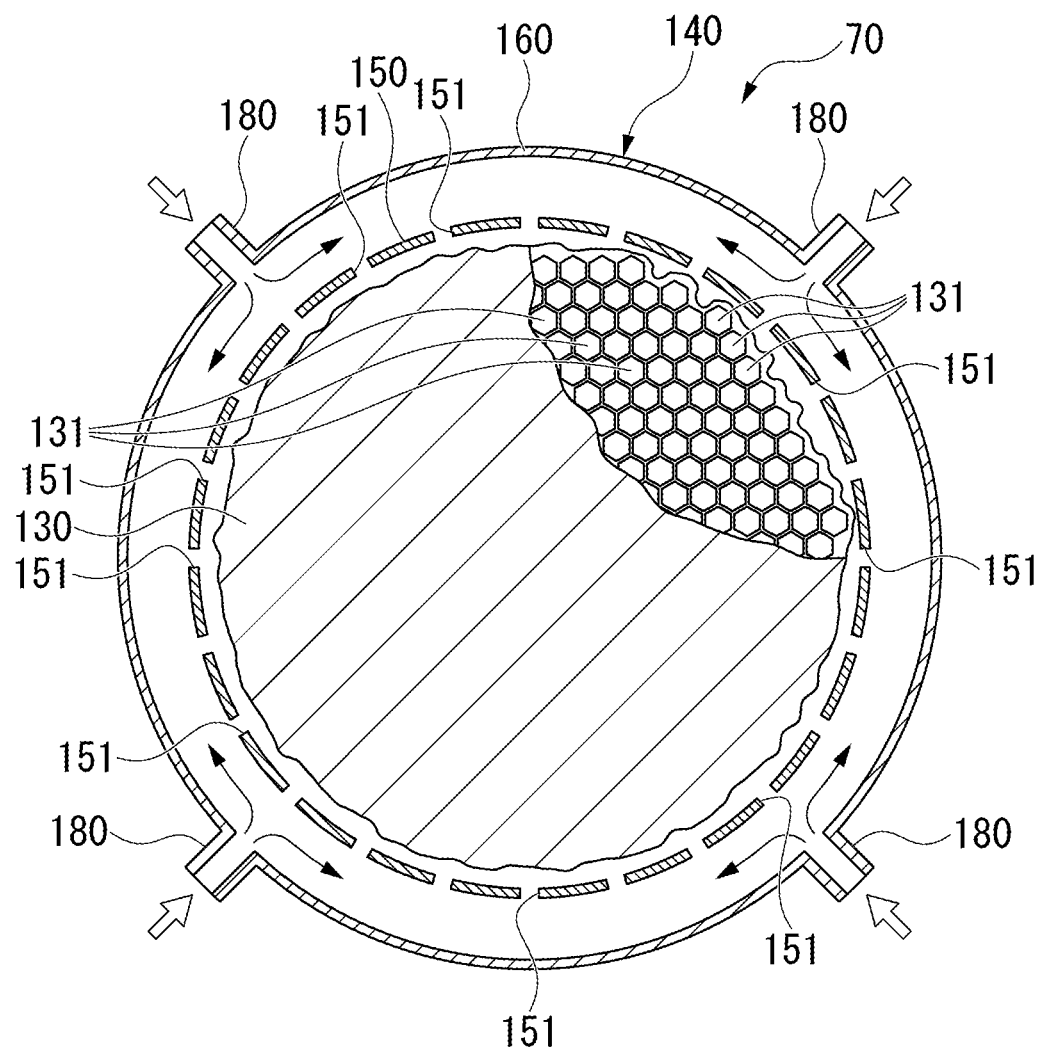
FIG. 20 is a cross-sectional view taken along a line A-A of FIG. 19.
Figure 21:
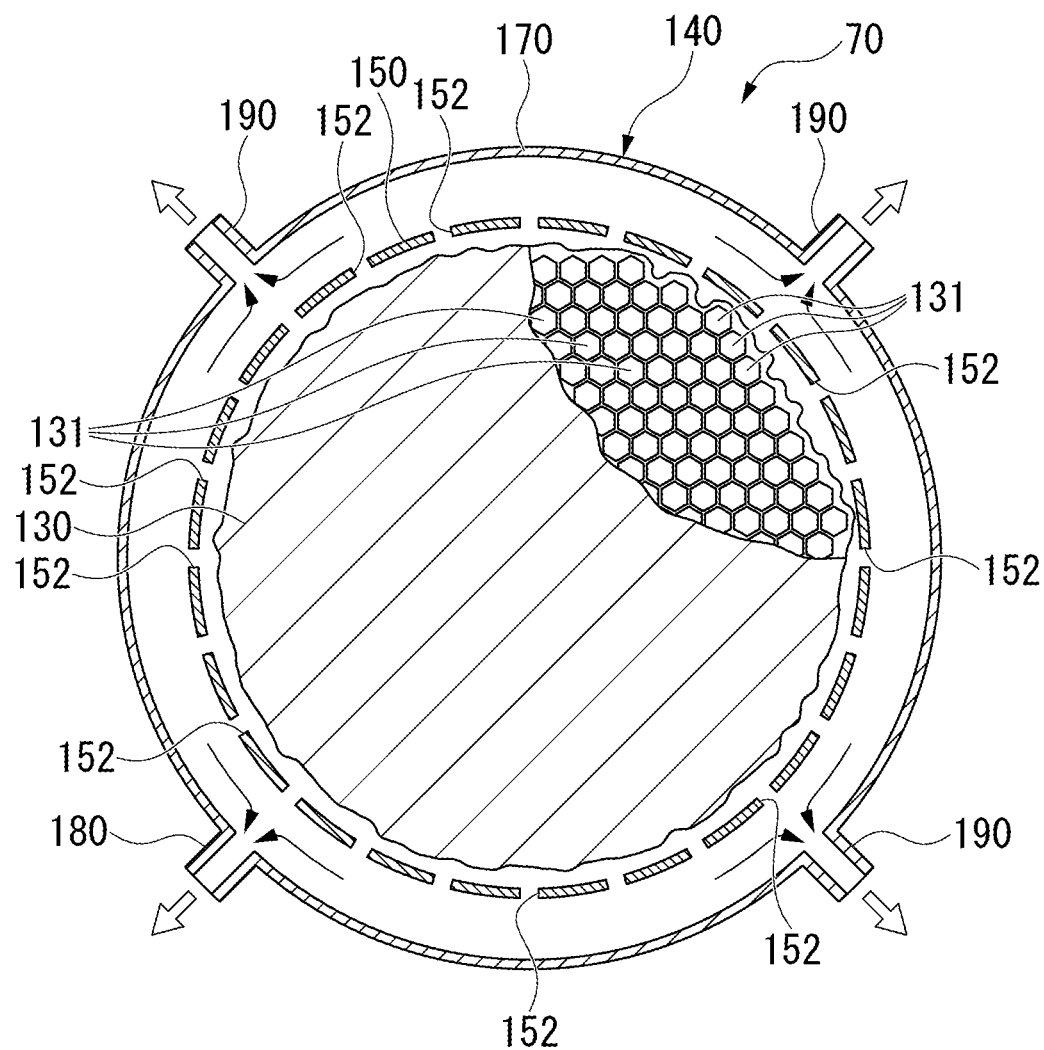
FIG. 21 is a cross-sectional view taken along a line B-B of FIG. 19.
Figure 22:
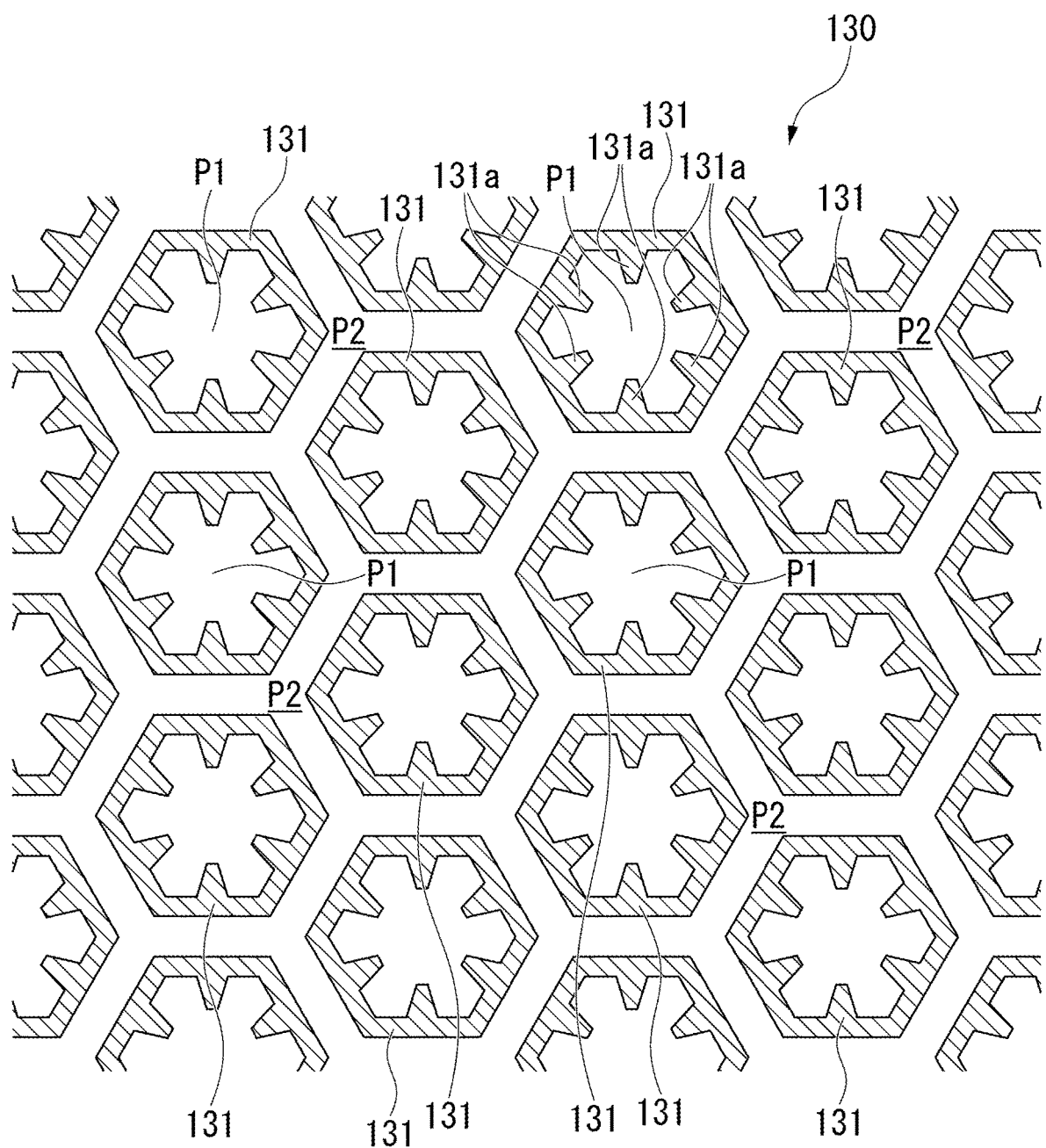
FIG. 22 is a main enlarged view of FIGS. 19 and 20 and is a horizontal cross-sectional view of a heat transfer pipe group.

As shown in FIGS. 19 to 21, the casing 140 is provided to cover the heat transfer pipe group 130 from the outer peripheral side. The casing 140 includes a tubular portion 150, an upper pipe plate 155, a lower pipe plate 156, an upper header 160, and a lower header 170.

The tubular portion 150 has a tubular shape extending in the vertical direction about the vertical axis O and has a cylindrical shape in this embodiment. The dimension of the tubular portion 150 in the vertical direction is substantially the same as the dimension of the heat transfer pipe group 130 in the vertical direction. Accordingly, the tubular portion 150 covers the heat transfer pipe group 130 from the outer peripheral side in the entire area in the vertical direction.

The upper pipe plate 155 is provided to close the upper end opening of the tubular portion 150. The upper pipe plate 155 is provided with a plurality of holes penetrating in the vertical direction. The upper end of each heat transfer pipe 131 of the heat transfer pipe group 130 is fitted into the hole. The upper end opening of the heat transfer pipe 131 is flush with the upper surface of the upper pipe plate 155. Accordingly, the upper end opening of the heat transfer pipe 131 communicates with the upper space while not being closed by the upper pipe plate 155.

The lower pipe plate 156 is provided to close the lower end opening of the tubular portion 150. The lower pipe plate 156 is provided with a plurality of holes penetrating in the vertical direction. The lower end of each heat transfer pipe 131 of the heat transfer pipe group 130 is fitted into the hole. The lower end opening of the heat transfer pipe 131 is flush with the lower surface of the lower pipe plate 156. Accordingly, the openings at the lower ends of the heat transfer pipes 131 are not closed by the pipe plate and communicate with the upper space.

That is, the upper pipe plate 155 and the lower pipe plate 156 support the heat transfer pipe group 130 in which the heat transfer pipes 131 are gathered at intervals. Further, a space surrounded by the tubular portion 150, the upper pipe plate 155, and the lower pipe plate 156 is formed as a coolant chamber into which the coolant C supplied from the outside is introduced. The coolant passage P2 between the heat transfer pipes 131 in the heat transfer pipe group 130 is located inside the coolant chamber.

(Upper Header)

As shown in FIG. 19, the upper header 160 is provided in an annular shape on the outer periphery of the upper end of the tubular portion 150. An annular flow path surrounding the tubular portion 150 is defined inside the upper header 160. As shown in FIG. 20, a plurality of upper communication holes 151 which penetrate the tubular portion 150 in the radial direction and are formed at intervals in the circumferential direction are provided at the height position corresponding to the upper header 160 in the tubular portion 150. That is, the inner space of the upper header 160 and the coolant chamber inside the tubular portion 150 communicate with each other through the upper communication holes 151.

(Lower Header)

As shown in FIG. 19, the lower header 170 is provided in an annular shape on the outer periphery of the lower end of the tubular portion 150. An annular flow path which surrounds the tubular portion 150 is defined inside the lower header 170. As shown in FIG. 20, a plurality of lower communication holes 152 are provided at the height position corresponding to the lower header 170 in the tubular portion 150 to penetrate the tubular portion 150 in the radial direction and to be separated from each other at intervals in the circumferential direction. That is, the inner space of the lower header 170 and the coolant chamber inside the tubular portion 150 communicate with each other through the lower communication hole 152.

(Coolant Supply Section)

The coolant supply section 180 supplies the coolant into the upper header 160. A plurality of the coolant supply sections 180 are provided on the outer peripheral surface of the upper header 160 at intervals in the circumferential direction (in this embodiment, four coolant supply sections are provided at equal intervals in the circumferential direction).

(Coolant Discharge Section)

The coolant discharge section 190 supplies the coolant C into the lower header 170. A plurality of the coolant discharge sections 190 are provided on the outer peripheral surface of the lower header 170 at intervals in the circumferential direction (in this embodiment, four coolant discharge sections are provided at equal intervals in the circumferential direction).

Operation and Effect of Fourth Embodiment

For example, the fourth cooling system 70 cools and condenses the coolant C which is evaporated by removing heat from the server 2.

When the drive unit 91 of the air blower 90 is driven to rotate, the impeller 93 rotates accordingly. Then, air is blown from below to above by the impeller 93. That is, air flowing into the lower housing 80 through the outer peripheral opening portion 81a and the upper opening portion 83a of the lower housing 80 passes through the introduction flow path between the inner annular wall 84 and the outer annular wall 85, passes between the blades 95 of the impeller 93, and is blown upward inside the upper housing 100. Air is mixed with water by the water injector 112 when flowing through the upper housing 100. Then, the air passes through the rectifying holes 110a of the rectifier 110 and becomes an upwardly rectified flow from which a swirling component is removed.

Such an air flow is introduced from below into the air passage P1 inside each heat transfer pipe 131 constituting the heat transfer pipe group 130 at the lower end of the heat exchange unit 120. The air introduced into the heat transfer pipe 131 flows through the air passage P1 along the linear shape of the heat transfer pipe 131 from below to above and is discharged to the outside from the upper end of the heat transfer pipe 131.

On the other hand, the coolant C which is vapor is introduced into the upper header 160 in the casing 140 of the heat exchange unit 120 through the coolant supply section 180. The coolant C which is introduced into the upper header 160 moves in the circumferential direction inside the upper header 160 and is introduced from any one of the plurality of upper communication holes 151 into the coolant chamber inside the tubular portion 150. The coolant C flows horizontally and downward through the coolant passage P2 between the heat transfer pipes 131 inside the coolant chamber. At this time, heat exchange is performed between the coolant C flowing through the coolant passage P2 and the air flowing through the air passage P1 via each heat transfer pipe 131. That is, the coolant C is cooled when the heat of the coolant C is transferred to the air and the coolant C is condensed into a liquid-phase coolant C in the course of flowing through the coolant passage P2.

The coolant C which is condensed in this way advances downward according to the weight and supply pressure of the coolant C and is discharged into the lower header 170 through the lower communication hole 152 formed at the lower end of the tubular portion 150. Then, the coolant C inside the lower header 170 is discharged to the outside of the heat exchange unit 120 from one of the plurality of coolant discharge sections 190 while moving in the circumferential direction. Such coolant C is transferred to the server 2 again to cool the server 2.

According to the fourth cooling system 70 with the above-described configuration, the air passages P1 inside the heat transfer pipes 131 are formed in a linear shape extending in the vertical direction in all heat transfer pipes 131. Therefore, the dust or dirt having entered the air passage P1 will escape downward due to their weight or upward due to the air blown by the air blower 90. Thus, it is possible to suppress dust or dirt from accumulating in the air passage P1.

Further, the air passage P1 inside each heat transfer pipe 131 can be seen from one direction, for example, by a maintenance worker. Therefore, it is possible to easily determine a certain air passage P1 having foreign matter. Further, since the air passage P1 has a linear shape, the air passage can be easily cleaned. That is, maintainability can be improved.

Further, the inner surface fin 131a which protrudes from the inner peripheral surface of the heat transfer pipe 131 is formed inside the heat transfer pipe 131. Accordingly, the contact area between the air flowing through the air passage P1 and the heat transfer pipe 131 can be modified and the heat exchange between the coolant C and the air can be promoted. Therefore, even if the total number of heat transfer pipes 131 is reduced, the coolant C can be sufficiently cooled.

Furthermore, since the fins extend uniformly in the vertical direction, the straightness of the air passage P1 is not impaired. Therefore, high maintainability can be maintained.

Further, since the casing 140 is configured to introduce the coolant C from the entire circumferential area to the coolant chamber through the upper header 160, it is possible to prevent the coolant C from being unevenly introduced into a part of the heat transfer pipe group 130 in the circumferential direction. Furthermore, since the coolant C having flowed through the coolant chamber is discharged from the entire circumferential area to the lower housing 80, it is possible to suppress the coolant C from becoming uneven at a part in the circumferential direction even in the lower portion of the coolant chamber. Accordingly, the flow distribution of the coolant C to the coolant passage can be made uniform, and heat exchange with the air can be efficiently performed.

Further, the drive unit 91 of the air blower 90 is provided on the radial inside of the inner annular wall 84 that defines the introduction flow path to the impeller 93. Therefore, the drive unit 91 does not become an obstacle to the air flow. Therefore, it is possible to suppress an uneven air flow and to obtain an appropriate flow distribution to each heat transfer pipe 131 of the heat exchange unit 120. Further, since the drive unit 91 is disposed in a dead space on the inside of the inner annular wall 84, it is not necessary to provide an extra space for the drive unit 91. Therefore, it is possible to prevent an increase in size of the fourth cooling system 70 as a whole.

Further, since the upper housing 100 is provided with the sound absorbing material, the sound generated by driving the impeller 93 can be absorbed by the sound absorbing material. Accordingly, it is possible to reduce the influence of noise generated by driving the fourth cooling system 70 on the surroundings.

Additionally, the sound absorbing material may be provided in the lower housing 80 in addition to the upper housing 100 or instead of the upper housing 100. Even with this configuration, the same operation and effect can be obtained.

Further, since the rectifier 110 is provided inside the upper housing 100, air can be introduced into the air passage inside the heat transfer pipe 131 along the air passage P1 of the heat transfer pipe 131 by allowing air to pass through the rectifying hole 110a of the rectifier 110. Therefore, the cooling performance can be stabilized without being influenced by wind in the external environment.

Further, water can be mixed into the air by the water injector 112 when passing through the upper housing 100. Accordingly, even when the outside air temperature is high, the heat of vaporization when water evaporates can be used to lower the apparent air temperature. Therefore, the cooling performance of the coolant C in the heat exchange unit 120 can be improved. Further, since the water is injected into the upper housing 100, the configuration can be completed in the inner space of the fourth cooling system 70 and hence a separate large-scale configuration does not need to be introduced. Therefore, the cooling performance can be improved by reducing the size and cost.

First Modified Example of Fourth Embodiment

Figure 23:
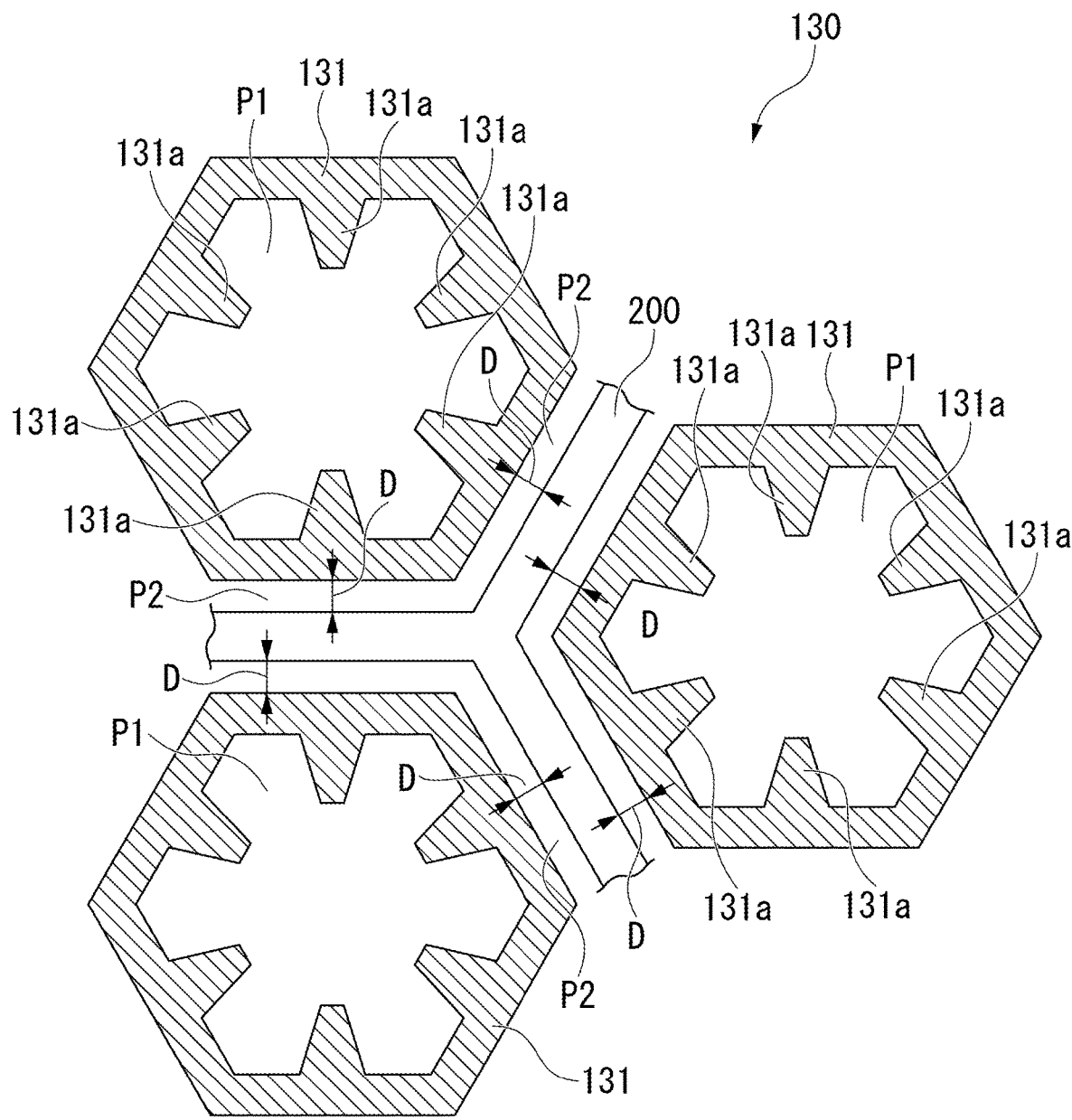
FIG. 23 is a horizontal cross-sectional view of a heat transfer pipe group of a first modified example of the fourth embodiment of the present disclosure.

For example, as shown in FIG. 23, a resistor 200 may be provided inside the coolant passage P2 of the heat transfer pipe group 130. A plurality of the resistors 200 are provided at intervals in the vertical direction, and have a plate shape with the vertical direction as the thickness direction. The resistor 200 extends in the horizontal direction along the coolant passage P2 in plan view. The resistor 200 extends in the same manner as the coolant passage P2 in a planar mesh shape with a predetermined passage interval D from the outer peripheral surface of the heat transfer pipe 131. The passage interval D is formed on both sides of the resistor 200 extending through the coolant passage P2.

According to such a configuration, the movement of the coolant C in the vertical direction is limited by the resistor 200. That is, since the resistance of the coolant C in the vertical direction increases, the coolant C easily advances in the horizontal direction. Accordingly, the coolant C can be appropriately spread even inside the heat transfer pipe group 130 in the radial direction and the flow distribution of the heat exchanger 40 can be made uniform as a whole.

Additionally, for example, the size of the passage interval D between the resistor 200 and the outer peripheral surface of the heat transfer pipe 131 may be increased inward in the heat transfer pipe group 130, that is, inward in the radial direction.

Accordingly, the coolant C can be actively made to reach the radially inner portion of the heat transfer pipe group 130 where the coolant C does not easily reach. Therefore, the flow distribution can be made further uniform.

First Modified Example of Fourth Embodiment

Figure 24:
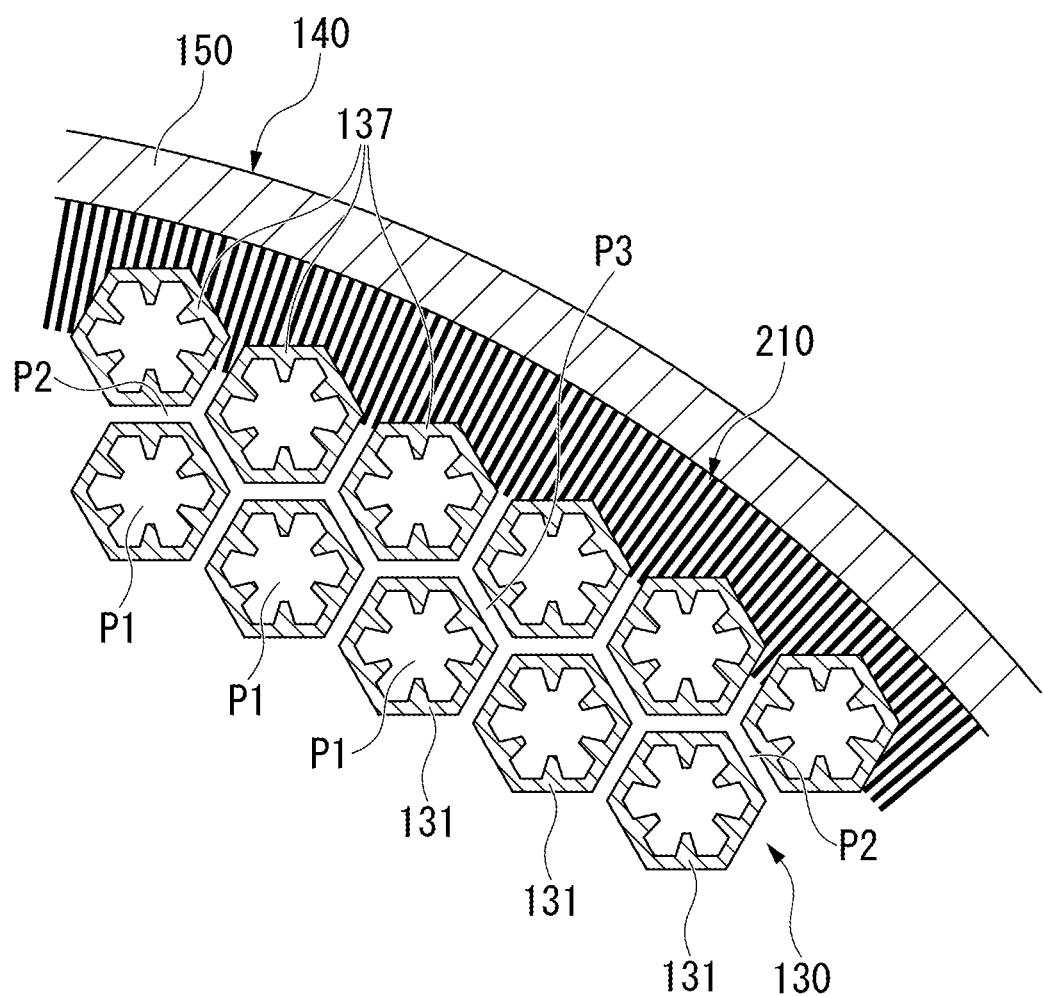
FIG. 24 is a horizontal cross-sectional view of a heat exchange unit of a second modified example of the fourth embodiment of the present disclosure.

For example, as shown in FIG. 24, a closing portion 210 that closes the space between the inner peripheral surface of the tubular portion 150 of the casing 140 and the outermost surface of the heat transfer pipe group 130 may be provided. The closing portion 210 is, for example, a brush having brush bristles that protrude radially inward from the inner peripheral surface of the tubular portion 150 and are arranged in the circumferential direction. Additionally, the closing portion 210 may fill a space between the inner peripheral surface of the tubular portion 150 of the casing 140 and the outermost surface of the heat transfer pipe group 130 and may be, for example, an elastic body such as sponge or rubber.

Accordingly, it is possible to suppress the coolant C from flowing through the gap between the heat transfer pipe group 130 and the casing 140 that do not contribute to heat exchange. Therefore, the coolant C can be actively introduced into the coolant passage P2 between the heat transfer pipes 131 capable of exchanging heat, and the heat exchange efficiency can be improved.

Other Embodiments

Although the embodiments of the present invention have been described above, the present invention is not limited thereto and can be modified as appropriate without departing from the technical idea of the invention.

For example, the coolant tank 3 of the first cooling system 1 of the first embodiment may be disposed in the indoor R inside the container 31 of the second cooling system 30 and a part of the heat pipe 10 and the plate-shaped fin 20 may be arranged in the outdoor E outside the container 31.

The third cooling system 50 of the third embodiment may be applied to the coolant tanks 3 of the first embodiment and the second embodiment.

Further, the fourth cooling system 70 of the fourth embodiment may be provided instead of the heat exchanger 40 of the second embodiment.

APPENDIX

The descriptions of the embodiments are understood, for example, as below.

The cooling system of (1) includes: the coolant tank 3 storing the coolant C removing heat from the heating element in a closed space as an inner space; the plurality of heat pipes 10 that are arranged to extend from the coolant tank 3 toward the outside of the coolant tank 3 and respectively have passages allowing the coolant C as the working fluid to be movable therethrough; and the blower fan 27 blowing air to the plurality of heat pipes 10 form the outside of the coolant tank 3 in a direction in which these heat pipes 10 are arranged, wherein a cross-sectional shape orthogonal to the extension direction of each heat pipe 10 is a flat plate shape having the leading edge 11 on the upstream side of the blowing direction and the trailing edge 12 on the downstream side thereof with the blowing direction as the longitudinal direction.

Accordingly, cooling is promoted at the leading edge 11 of the heat pipe 10 and cooling is inhibited at the trailing edge 12. Therefore, since the coolant C is easily condensed on the side of the leading edge 11 of the heat pipe 10, a passage for the liquid-phase coolant C is formed, and since the coolant C is easily condensed on the side of the trailing edge 12, a passage for the gas-phase coolant C is formed. Therefore, the movement of the coolant C within the heat pipe 10 is promoted and heat can be efficiently transferred.

The cooling system of (2) is the cooling system of (1) in which the heat pipes 10 are arranged to be sparse on the downstream side than on the upstream side in the blowing direction.

On the downstream side where the temperature of the air rises, the air density decreases and the volumetric flow rate increases. Therefore, the pressure loss can be optimized by allowing the group of the heat pipes 10 to be sparse on the downstream side.

The cooling system of (3) is the cooling system of (1) or (2) further including: the plate-shaped fin 20 extending in a direction orthogonal to the extension direction of the plurality of heat pipes 10 outside the coolant tank 3 and has the through hole 21 through which these heat pipes 10 pass, wherein the leading edge 11 of the heat pipe 10 contacts the inner peripheral edge of the through hole 21 of the plate-shaped fin 20, and wherein a gap is formed between the trailing edge 12 of the heat pipe 10 and the inner peripheral edge of the through hole 21 of the plate-shaped fin 20.

Accordingly, the condensation of the coolant C on the side of the trailing edge 12 can be prevented while promoting the condensation of the coolant C on the side of the leading edge 11 of the heat pipe 10.

The cooling system of (4) is the cooling system of any one of (1) to (3), wherein the heat pipe 10 includes the partition portion 15 separating the passage inside the heat pipe 10 into the upstream leading edge passage 16 and the downstream trailing edge passage 17.

Accordingly, the gas-phase passage (vapor passage) and the liquid-phase passage (condensate passage) of the coolant C in the heat pipe 10 can be defined and the transfer efficiency can be improved.

The cooling system of (5) is the cooling system of any one of (1) to (4), wherein the heat pipe 10 has an end located on the inside of the coolant tank 3 to communicate with the inside of the coolant tank 3 and the coolant C inside the coolant tank 3 is the same as the coolant C inside the heat pipe 10.

Accordingly, a pump or the like for circulating the coolant C can be made unnecessary.

The cooling system of (6) is the cooling system of any one of (1) to (4), wherein the heat pipe 10 is closed at an end on the inside of the coolant tank 3 and extends to the inside of the coolant tank 3 to be immersed in the coolant C, wherein the coolant C inside the coolant tank 3 is the first coolant C1, and wherein the coolant C inside the heat pipe 10 is the second coolant C2.

Even with this configuration, a pump or the like for circulating the coolant C can be made unnecessary.

The cooling system of (7) is the cooling system including: the outer wall defining the indoor R and the outdoor E; the coolant tank 3 that is disposed in the indoor R and storing the coolant C for removing heat from the heating element in a closed space as an inner space; the heat exchanger 40 that is disposed in the outdoor E; the gas-phase pipe 47 guiding the coolant C as a working fluid, having evaporated in the coolant tank 3 to become a gas phase, to the heat exchanger 40; and the liquid-phase pipe 48 guiding the coolant C as a working fluid, having changed from a gas phase to a liquid phase, in the heat exchanger 40 to the coolant tank 3.

The coolant C evaporated by taking heat away from the heating element in the coolant tank 3 is introduced into the gas-phase pipe 47 and guided to the heat exchanger 40 in the outdoor E. The coolant C is condensed in the heat exchanger 40 to become condensed water, which flows through the liquid-phase pipe 48 by its own weight and is introduced into the coolant tank 3. Therefore, the heating element can be efficiently cooled without providing a pump or the like for circulating the coolant C.

The cooling system of (8) is the cooling system of (7) further including: the duct forming portion 49 forming a duct passage extending from below to above together with the outer surface of the outer wall, wherein the heat exchanger 40 is provided inside the duct passage.

A high-temperature coolant C is introduced into the heat exchanger 40 to generate an upward airflow in the duct, and outside air is introduced into the duct. Accordingly, cooling of the coolant C in the heat exchanger 40 can be performed more efficiently.

The cooling system of (9) is the cooling system of (7) or (8), wherein the heat exchanger 40 is integrally provided along the outer surface of the outer wall.

By providing the heat exchanger 40 integrally with the outer wall itself, the outer wall itself can be used as the heat radiator 51. Accordingly, the heat exchanger 40 that is compact and has high condensation performance of the coolant C can be realized.

The cooling system of (10) is the cooling system of any one of (1) to (9), further including: the heat radiator 51 that is disposed inside the coolant tank 3 to be immersed in the coolant C and receives heat transferred from the heating element; and the heat transfer promoting unit that is configured to promote heat transfer from the heat radiation surface 51a of the heat radiator 51.

Accordingly, for example, since adhesion of the vapor film to the heat radiator 51 can be suppressed, a high heat transfer rate between the coolant C and the heat radiator 51 can be maintained.

Further, when a single-phase flow of the coolant is formed on the heat radiation surface of the heat radiator, heat transfer can be promoted by disturbing the single-phase flow.

The cooling system of (11) is the cooling system including: the coolant tank 3 storing the coolant C removing heat from the heating element in a closed space as an inner space; the heat radiator 51 that is allowed to be immersed in the coolant C inside the coolant tank 3 and by which heat transferred from the heating element is received; and the vapor film removing unit (heat transfer promoting unit) 60 that is configured to promote heat transfer from the heat radiation surface 51a of the heat radiator 51.

In addition to suppressing the vapor film from adhering to the heat radiator 51, the heat transfer rate between the coolant C and the heat radiator 51 can be maintained high by disturbing the flow.

The cooling system of (12) is the cooling system of (10) or (11), wherein the heat transfer promoting unit includes the ultrasonic generator 61 which is configured to apply ultrasonic waves to the heat radiation surface 51a of the heat radiator 51.

Accordingly, adhesion of the vapor film to the heat radiation surface 51a of the heat radiator 51 can be suppressed, and the flow on the heat radiation surface can be disturbed. For example, this leads to a transition from a laminar flow area to a turbulent flow area.

The cooling system of (13) is the cooling system of any one of (10) to (12), wherein the heat transfer promoting unit includes the jet injector 62 that is configured to inject a jet stream due to the coolant C to the heat radiation surface 51a of the heat radiator 51.

Accordingly, adhesion of the vapor film to the heat radiation surface 51a of the heat radiator 51 can be suppressed, and the flow on the heat radiation surface can be disturbed.

The cooling system of (14) is the cooling system of (13), wherein the heat transfer promoting unit further includes the flow path forming portion 63 forming a flow path extending in the flow direction of the jet stream on the heat radiation surface 51a of the heat radiator 51.

Accordingly, adhesion of the vapor film to the heat radiation surface 51a of the heat radiator 51 can be suppressed, and the flow on the heat radiation surface can be disturbed.

The cooling system of (15) is the cooling system of any one of (10) to (14), wherein the heat transfer promoting unit includes the swirling flow generator 64 that is configured to generate a swirling flow due to the coolant C on the heat radiation surface 51a of the heat radiator 51.

Accordingly, adhesion of the vapor film to the heat radiation surface 51a of the heat radiator 51 can be suppressed, and the flow on the heat radiation surface can be disturbed.

The cooling system of (16) is the cooling system of any one of (10) to (15), wherein the heat transfer promoting unit includes the binder 65 that is provided on the heat radiation surface 51a of the heat radiator 51 and has higher thermal conductivity than the heat radiator 51.

Accordingly, adhesion of the vapor film to the heat radiation surface 51a of the heat radiator 51 can be suppressed, and the flow on the heat radiation surface can be disturbed.

The cooling system of (17) is the cooling system of any one of (10) to (15), wherein the heat transfer promoting unit includes the heat radiating fin 66 that is provided to protrude from the heat radiation surface 51a of the heat radiator 51.

Accordingly, adhesion of the vapor film to the heat radiation surface 51a of the heat radiator 51 can be suppressed, and the flow on the heat radiation surface can be disturbed.

The cooling system of (18) is the cooling system including: the heat exchange unit 120 including the heat transfer pipe group 130 which includes the plurality of heat transfer pipes 131 linearly extending in the vertical direction and having the air passage P1 formed therein and in which the coolant passages P2 are formed between the heat transfer pipes 131 by bundling these heat transfer pipes 131 at intervals, the casing 140 covering the heat transfer pipe group 130 so that both ends of each heat transfer pipe 131 open to the outside, the coolant supply section 180 supplying the coolant C into the casing 140, and the coolant discharge section 190 discharging the coolant C from the inside of the casing 140; and the air blower 90 that is provided below the heat exchange unit 120 and blowing air to the heat transfer pipe group 130 from below.

The air passages P1 inside the heat transfer pipes 131 are formed in a linear shape extending in the vertical direction in all heat transfer pipes 131. Therefore, since dust or dirt is not easily accumulated in the air passage P1 and the air passage P1 can be seen from one direction, cleaning and the like can be easily performed.

The cooling system of (19) is the cooling system of (18), wherein the heat transfer pipe 131 includes the inner surface fin 131a that is protruded from the inner peripheral surface of the heat transfer pipe 131 and extends in the vertical direction.

Accordingly, heat exchange between the coolant C and the air can be promoted. Therefore, even if the total number of heat transfer pipes 131 is reduced, the coolant C can be sufficiently cooled, and the manufacturability and maintainability can be improved.

The cooling system of (20) is the cooling system of (18) or (19), wherein the casing 140 includes the tubular portion 150 surrounding the heat transfer pipe group 130 from the outer peripheral side, the upper header 160 that is formed in an annular shape surrounding the tubular portion 150 from the outer peripheral side at the upper portion of the tubular portion 150 and is provided with one of the coolant supply section 180 and the coolant discharge section 190, and the lower header 170 that is formed in an annular shape surrounding the tubular portion 150 from the outer peripheral side at the lower portion of the tubular portion 150 and is provided with the other of the coolant supply section 180 and the coolant discharge section 190, and wherein the tubular portion 150 includes the plurality of upper communication holes 151 that are formed at intervals in the circumferential direction for communicating between the inner space of the upper header 160 and the inner space of the tubular portion 150 and the plurality of lower communication holes 152 that are formed at intervals in the circumferential direction for communicating between the inner space of the lower header 170 and the inner space of the tubular portion 150.

Accordingly, the flow distribution of the coolant C to the coolant passage can be made uniform.

The cooling system of (21) is the cooling system of one of (18) to (20), wherein the heat exchange unit 120 further includes the resistor 200 extending in the horizontal direction with a predetermined horizontal gap with respect to the outer peripheral surface of the heat transfer pipe 131 inside the coolant passage P2.

The resistor 200 allows the coolant C to be easily introduced not only in the vertical direction but also in the horizontal direction. Therefore, the flow distribution of the heat exchange unit 120 can be made more uniform as a whole.

The cooling system of (22) is the cooling system of (21), wherein the resistor 200 is formed so that a gap between the resistor and the heat transfer pipe 131 increases from the outside to the inside in the radial direction of the heat exchange unit 120.

Accordingly, it becomes easier for the coolant C to reach the radially inner side where the coolant C cannot easily reach. Therefore, the flow distribution can be made even more uniform.

The cooling system of (23) is the cooling system of any one of (18) to (22), wherein the heat exchange unit 120 further includes the closing portion 210 closing a space between the inner surface of the casing 140 and the outermost surface of the heat transfer pipe group 130.

Accordingly, it is possible to suppress the coolant C from flowing through the gap between the heat transfer pipe group 130 and the casing 140 that do not contribute to heat exchange.

The cooling system of (24) is the cooling system of any one of (18) to (23), wherein the air blower 90 includes the impeller 93 that is rotatable around an axis extending in the vertical direction and the drive unit 91 that is disposed below the impeller 93 and rotationally driving the impeller 93, and wherein the cooling system further includes: the upper housing 100 having a tubular shape extending in the vertical direction to surround the impeller 93 from the outer peripheral side, forms an air flow path therein, and has an upper end connected the lower end of the heat exchange unit 120; and the lower housing 80 including the inner annular wall 84 decreasing in diameter upward while covering the drive unit 91 from the outer peripheral side and the outer annular wall 85 decreasing in diameter upward while covering the inner annular wall 84 from the outer peripheral side and forming an air introduction flow path to the impeller 93 together with the inner annular wall 84.

Accordingly, the drive unit 91 does not become an obstacle to the air flow and drift can be avoided. In addition, a compact configuration can be realized as a whole.

The cooling system of (25) is the cooling system of (24), wherein at least a part of the upper housing 100 and the lower housing 80 is formed by a sound absorbing material.

Accordingly, noise to the surroundings can be reduced.

The cooling system of (26) is the cooling system of (24) or (25) further including: the rectifier 110 that is provided in an air flow path inside the upper housing 100 and has the plurality of rectifying holes 110*a* arranged in the horizontal direction to penetrate in the vertical direction.

Accordingly, air can be introduced along the air passage P1 of the heat transfer pipe 131. Therefore, the cooling performance can be stabilized without being influenced by wind in the external environment.

The cooling system of (27) is the cooling system of any one of (24) to (26) further including: the water supply unit supplying water to an air flow path inside the upper housing 100.

Accordingly, the cooling performance of the coolant C in the heat exchange unit 120 can be further improved.

The present disclosure relates to the cooling system for improving the cooling efficiency of the electronic device.

According to the cooling system of the present disclosure, it is possible to provide the cooling system that saves energy when transferring the coolant, maintains high ability of removing heat from the heating element by the coolant, and has high maintainability.

REFERENCE SIGNS LIST

1 First cooling system
2 Server
3 Coolant tank
3*a* Tank bottom wall
3*b* Tank side wall
3*c* Tank top wall
10 Heat pipe
11 Leading edge
12 Trailing edge
13 Leading edge side area
14 Trailing edge side area
15 Partition portion
16 Leading edge passage
17 Trailing edge passage
20 Plate-shaped fin
21 Through hole
21*a* Contact edge portion
21*b* Contacted edge portion
25 Cover
27 Blower fan
30 Second cooling system
31 Container
32 Bottom wall
33 Side wall
34 Top wall
40 Heat exchanger
41 External heat transfer pipe
42 Upstream header
43 Downstream header
44 External fin
47 Gas-phase pipe
48 Liquid-phase pipe
49 Duct forming portion
50 Third cooling system
51 Heat radiator
51*a* Heat radiation surface
60 Vapor film removing unit (heat transfer promoting unit)
61 Ultrasonic generator
62 Jet injector
63 Flow path forming portion
64 Swirling flow generator
64*a* Propeller
65 Binder
66 Heat radiating fin
70 Fourth cooling system
80 Lower housing
81 Housing outer peripheral wall
81*a* Outer peripheral opening portion
82 Housing bottom wall
83 Housing top wall
83*a* Upper opening portion
84 Inner annular wall
85 Outer annular wall
88 Leg portion
90 Air blower
91 Drive unit
92 Shaft portion
93 Impeller
94 Boss portion
95 Blade
100 Upper housing
100*a* First inner peripheral surface
100*b* Second inner peripheral surface
110 Rectifier
110*a* Rectifying hole
112 Water injector
120 Heat exchange unit
130 Heat transfer pipe group 131 Heat transfer pipe
131a Inner surface fin
140 Casing
150 Tubular portion
151 Upper communication hole
152 Lower communication hole
155 Upper pipe plate
156 Lower pipe plate
160 Upper header
170 Lower header
180 Coolant supply section
190 Coolant discharge section
200 Resistor
210 Closing portion
C Coolant
C1 First coolant
C2 Second coolant
R Indoor
E Outdoor
F1 Gas-phase flow
F2 Liquid-phase flow
O Vertical axis
P1 Air passage
P2 Coolant passage
D Passage interval

What is claimed is:

1. A cooling system comprising:
a heat exchange unit including a heat transfer pipe group which includes a plurality of heat transfer pipes linearly extending in a vertical direction and having an air passage formed therein and in which coolant passages are formed between the heat transfer pipes by bundling the heat transfer pipes at intervals, a casing covering the heat transfer pipe group so that both ends of each heat transfer pipe open to the outside, a coolant supply section supplying a coolant into the casing, and a coolant discharge section discharging the coolant from the inside of the casing; and
an air blower that is provided below the heat exchange unit and blowing air to the heat transfer pipe group from below,
wherein the air blower includes an impeller that is rotatable around an axis extending in a vertical direction and a drive unit that is disposed below the impeller and rotationally driving the impeller, and
wherein the cooling system further comprises:
an upper housing having a tubular shape extending in a vertical direction to surround the impeller from an outer peripheral side, forms an air flow path therein, and has an upper end connected to a lower end of the heat exchange unit; and
a lower housing including an inner annular wall decreasing in diameter upward while covering the drive unit from an outer peripheral side and an outer annular wall decreasing in diameter upward while covering the inner annular wall from an outer peripheral side and forming an air introduction flow path to the impeller together with the inner annular wall.

2. The cooling system according to claim 1,
wherein the heat transfer pipe includes an inner surface fin that is protruded from an inner peripheral surface of the heat transfer pipe and extends in a vertical direction.

3. The cooling system according to claim 1,
wherein the casing includes a tubular portion surrounding the heat transfer pipe group from an outer peripheral side, an upper header that is formed in an annular shape surrounding the tubular portion from an outer peripheral side at an upper portion of the tubular portion and is provided with one of the coolant supply section and the coolant discharge section, and a lower header that is formed in an annular shape surrounding the tubular portion from an outer peripheral side at a lower portion of the tubular portion and is provided with the other of the coolant supply section and the coolant discharge section, and
wherein the tubular portion includes a plurality of upper communication holes that are formed at intervals in a circumferential direction for communicating between an inner space of the upper header and an inner space of the tubular portion and a plurality of lower communication holes that are formed at intervals in a circumferential direction for communicating between an inner space of the lower header and the inner space of the tubular portion.

4. The cooling system according to claim 1,
wherein the heat exchange unit further includes a resistor extending in a horizontal direction with a predetermined horizontal gap with respect to an outer peripheral surface of the heat transfer pipe inside the coolant passage.

5. The cooling system according to claim 4,
wherein the resistor is formed so that a gap between the resistor and the heat transfer pipe is increased from an outside to an inside in a radial direction of the heat exchange unit.

6. The cooling system according to claim 1,
wherein the heat exchange unit further includes a closing portion closing a space between an inner surface of the casing and an outermost surface of the heat transfer pipe group.

7. The cooling system according to claim 1,
wherein at least a part of the upper housing and the lower housing is formed by a sound absorbing material.

8. The cooling system according to claim 1, further comprising:
a rectifier that is provided in an air flow path inside the upper housing and has a plurality of rectifying holes arranged in a horizontal direction to penetrate in a vertical direction.

9. The cooling system according to claim 1, further comprising:
a water supply unit supplying water to an air flow path inside the upper housing.

* * * * *